(12) United States Patent  
Watanabe et al.

(10) Patent No.: US 10,818,718 B2  
(45) Date of Patent: Oct. 27, 2020

(54) LIGHT RECEIVING ELEMENT, METHOD OF MANUFACTURING LIGHT RECEIVING ELEMENT, IMAGING DEVICE, AND ELECTRONIC APPARATUS

(71) Applicant: SONY CORPORATION, Tokyo (JP)

(72) Inventors: Tomomasa Watanabe, Kanagawa (JP); Shunsuke Maruyama, Kanagawa (JP); Noriyuki Futagawa, Kanagawa (JP)

(73) Assignee: Sony Corporation, Toyko (JP)

( * ) Notice: Subject to any disclaimer, the term of this patent is extended or adjusted under 35 U.S.C. 154(b) by 0 days.

(21) Appl. No.: 16/316,670

(22) PCT Filed: May 26, 2017

(86) PCT No.: PCT/JP2017/019731  
§ 371 (c)(1),  
(2) Date: Jan. 10, 2019

(87) PCT Pub. No.: WO2018/016181  
PCT Pub. Date: Jan. 25, 2018

(65) Prior Publication Data  
US 2019/0157324 A1 May 23, 2019

(30) Foreign Application Priority Data  
Jul. 20, 2016 (JP) ................. 2016-142826

(51) Int. Cl.  
*G01J 5/20* (2006.01)  
*H01L 27/146* (2006.01)  
*H04N 5/378* (2011.01)

(52) U.S. Cl.  
CPC ........ *H01L 27/1463* (2013.01); *H01L 27/146* (2013.01); *H01L 27/14627* (2013.01); *H01L 27/14649* (2013.01); *H04N 5/378* (2013.01)

(58) Field of Classification Search  
CPC .............. H01L 27/1463; H01L 27/146; H01L 27/14627; H01L 27/14649;  
(Continued)

(56) References Cited

U.S. PATENT DOCUMENTS 8,395,194 B2 * 3/2013 Yokoyama ........ H01L 27/14623  
257/223  
2009/0295979 A1 * 12/2009 Matsuo ............ H01L 27/14636  
348/335  
(Continued)

FOREIGN PATENT DOCUMENTS

JP   S62-219567   9/1987  
JP   2010-067827   3/2010  
(Continued)

OTHER PUBLICATIONS

Extended European Search Report for European Patent Application No. 17830701.3, dated Jun. 3, 2019, 6 pages.  
(Continued)

*Primary Examiner* — Kiho Kim  
(74) *Attorney, Agent, or Firm* — Sheridan Ross P.C.

(57) ABSTRACT

A light receiving element according to an embodiment of the present disclosure includes a plurality of pixels, a photoelectric conversion layer common to the plurality of pixels, a first electrode layer provided on side of a light incident surface of the photoelectric conversion layer, and a light-shielding section embedded between the plurality of pixels adjacent to each other of the first electrode layer.

18 Claims, 19 Drawing Sheets

(58) Field of Classification Search
CPC ......... H01L 27/14621; H01L 27/14623; H01L 27/14636; H04N 5/378
See application file for complete search history.

(56) References Cited

U.S. PATENT DOCUMENTS

| | | |
|---|---|---|
| 2010/0060769 A1 | 3/2010 | Inuiya |
| 2011/0205412 A1 | 8/2011 | Miyazaki et al. |
| 2013/0341694 A1 | 12/2013 | Maekawa et al. |
| 2015/0228685 A1 | 8/2015 | Uchida et al. |
| 2016/0035780 A1 | 2/2016 | Itahashi et al. |
| 2016/0049430 A1 | 2/2016 | Nomura |

FOREIGN PATENT DOCUMENTS

| | | |
|---|---|---|
| JP | 2014-060380 | 4/2014 |
| JP | 2015-149422 | 8/2015 |
| JP | 2016-058559 | 4/2016 |

OTHER PUBLICATIONS

International Search Report prepared by the Japan Patent Office dated Jul. 20, 2017, for International Application No. PCT/JP2017/019731.

\* cited by examiner

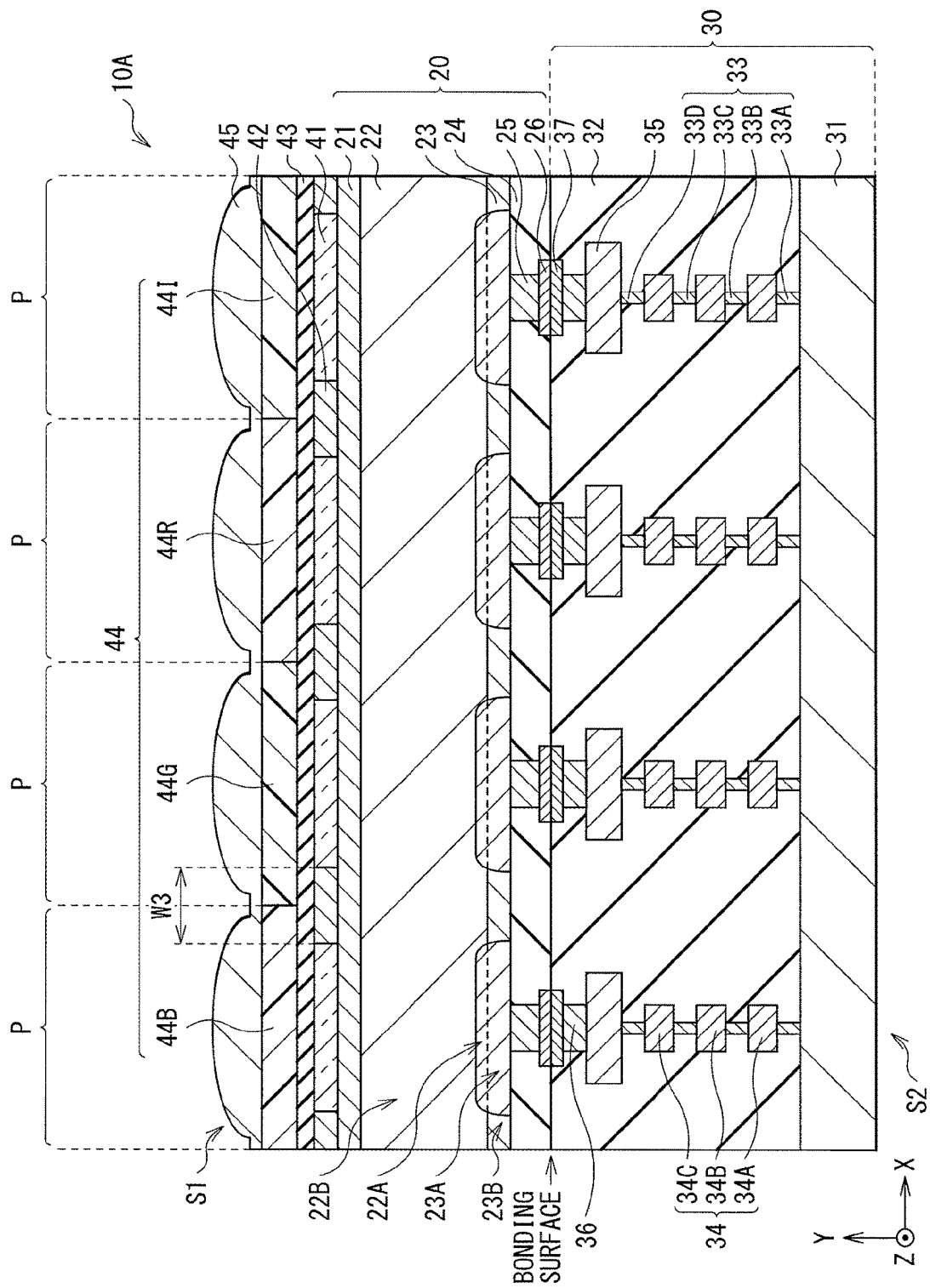

[ FIG. 2A ]
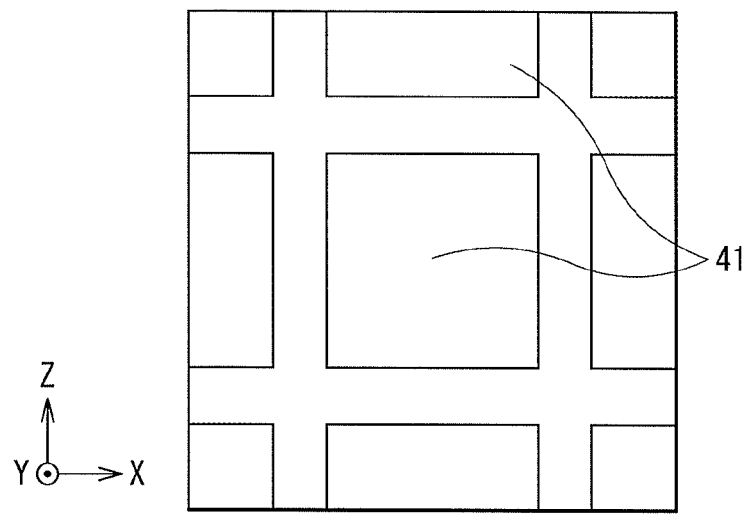
[ FIG. 2B ]
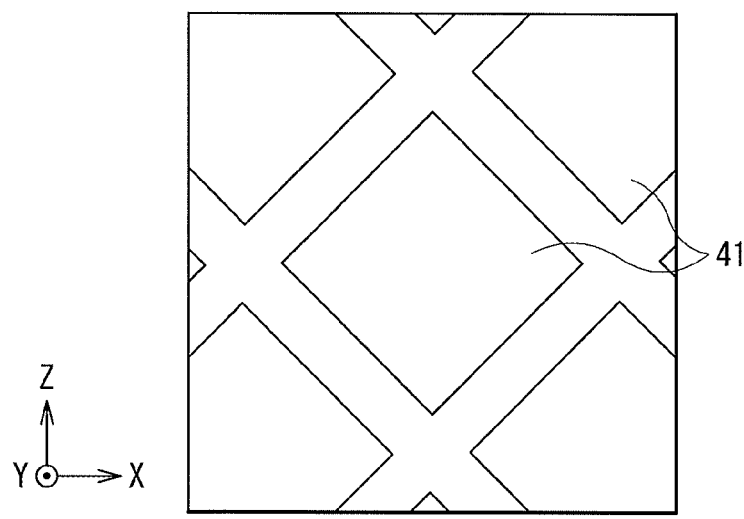
[ FIG. 2C ]
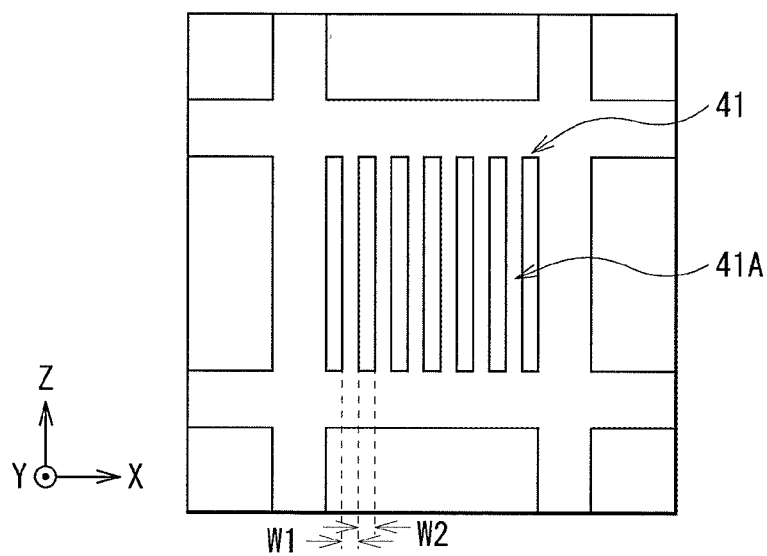

[ FIG. 2D ]
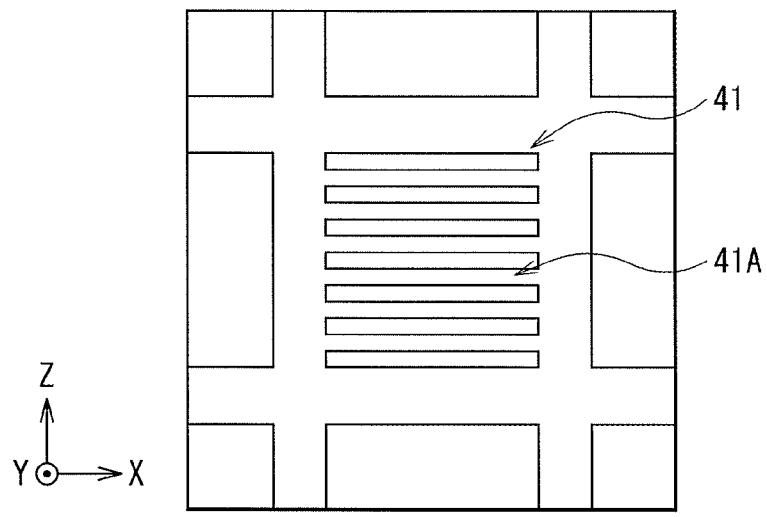
[ FIG. 2E ]
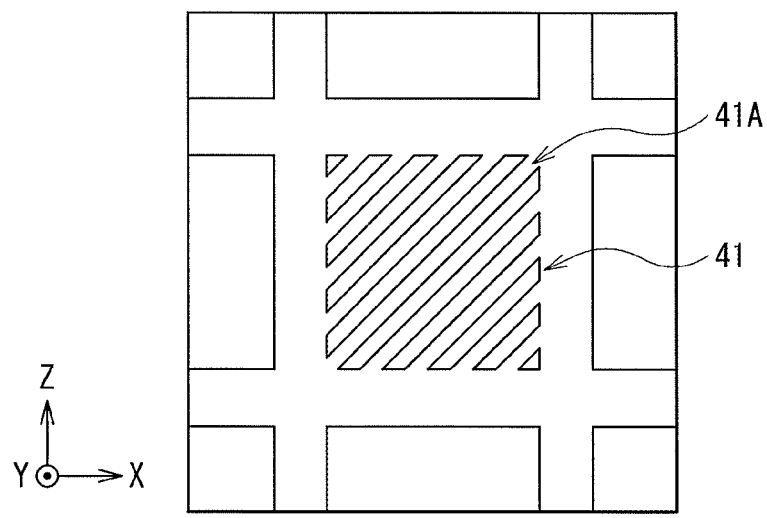
[ FIG. 2F ]
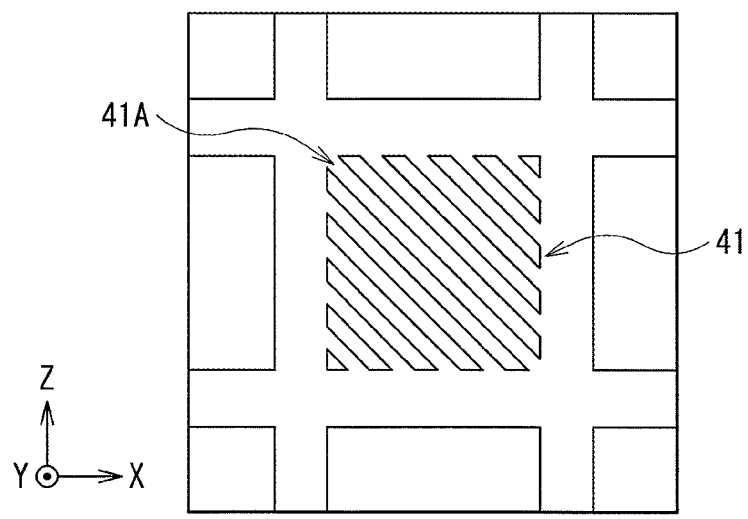

[ FIG. 2G ]
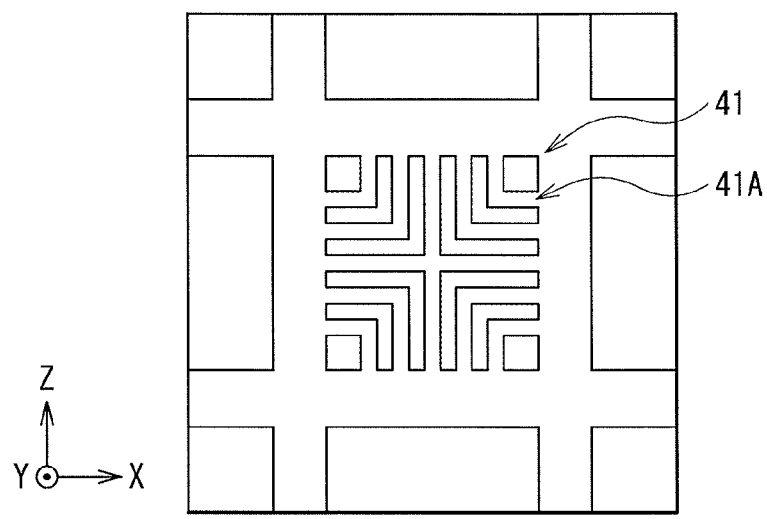
[ FIG. 3 ]
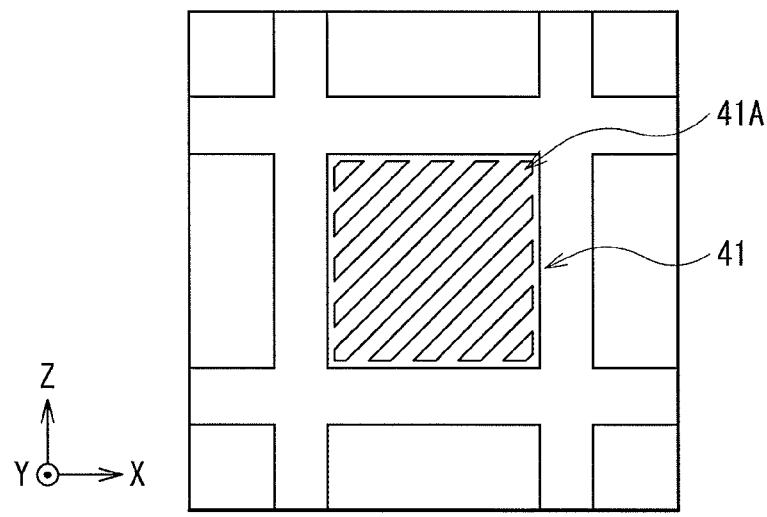

[ FIG. 4A ]
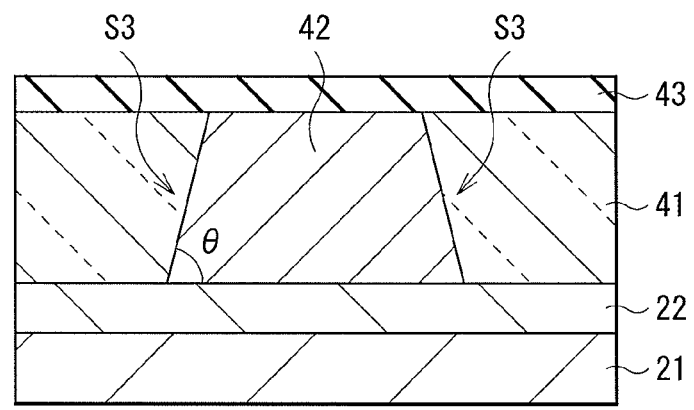
[ FIG. 4B ]
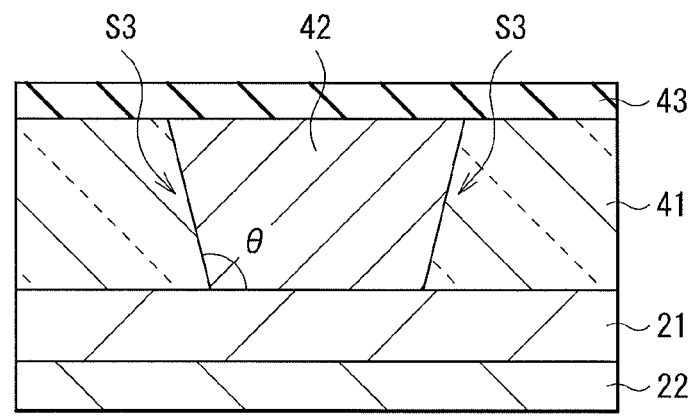

[ FIG. 4C ]
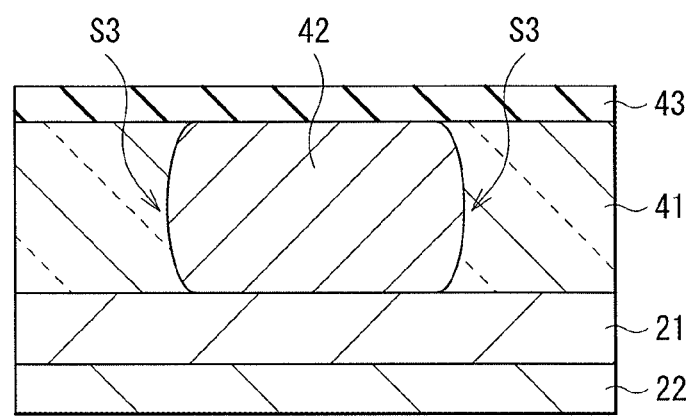
[ FIG. 4D ]
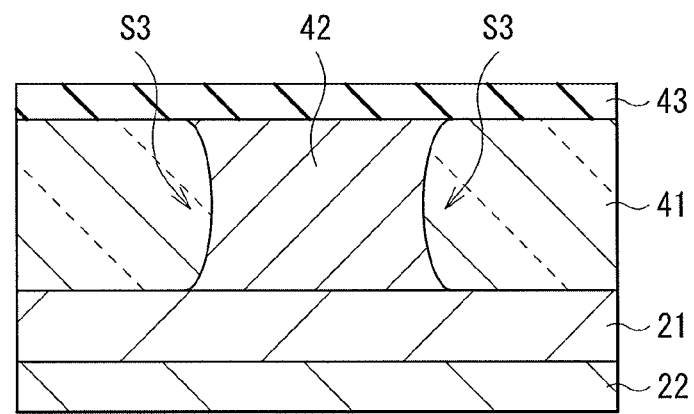

[ FIG. 5A ]
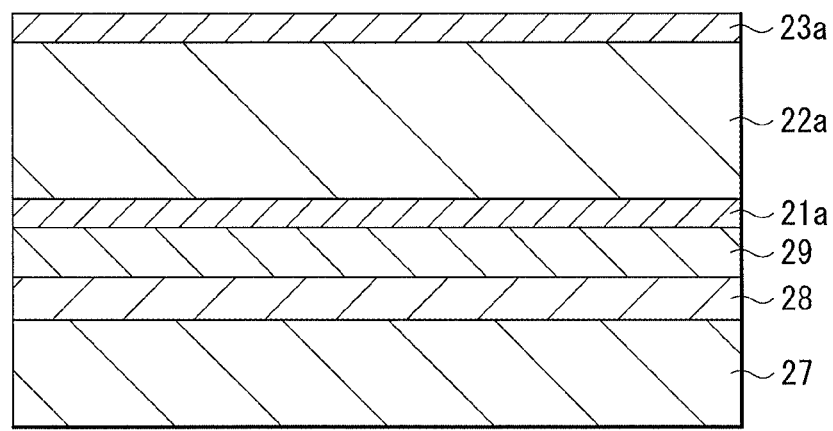
[ FIG. 5B ]
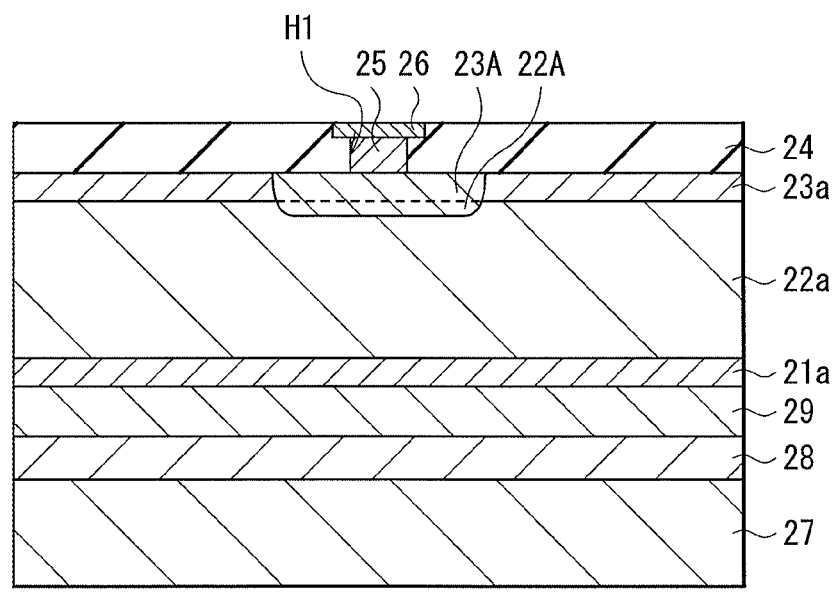

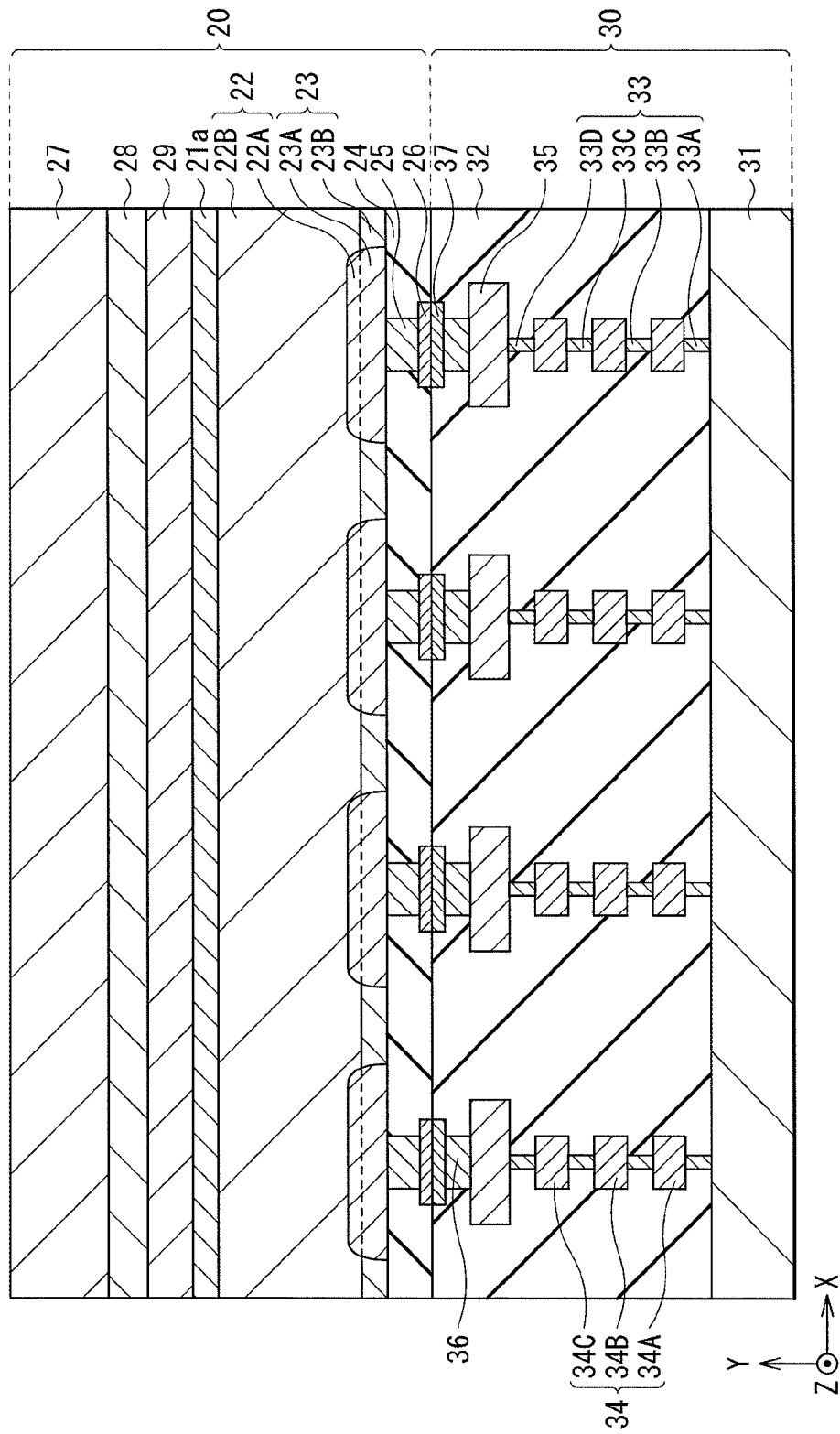
[FIG. 5C]

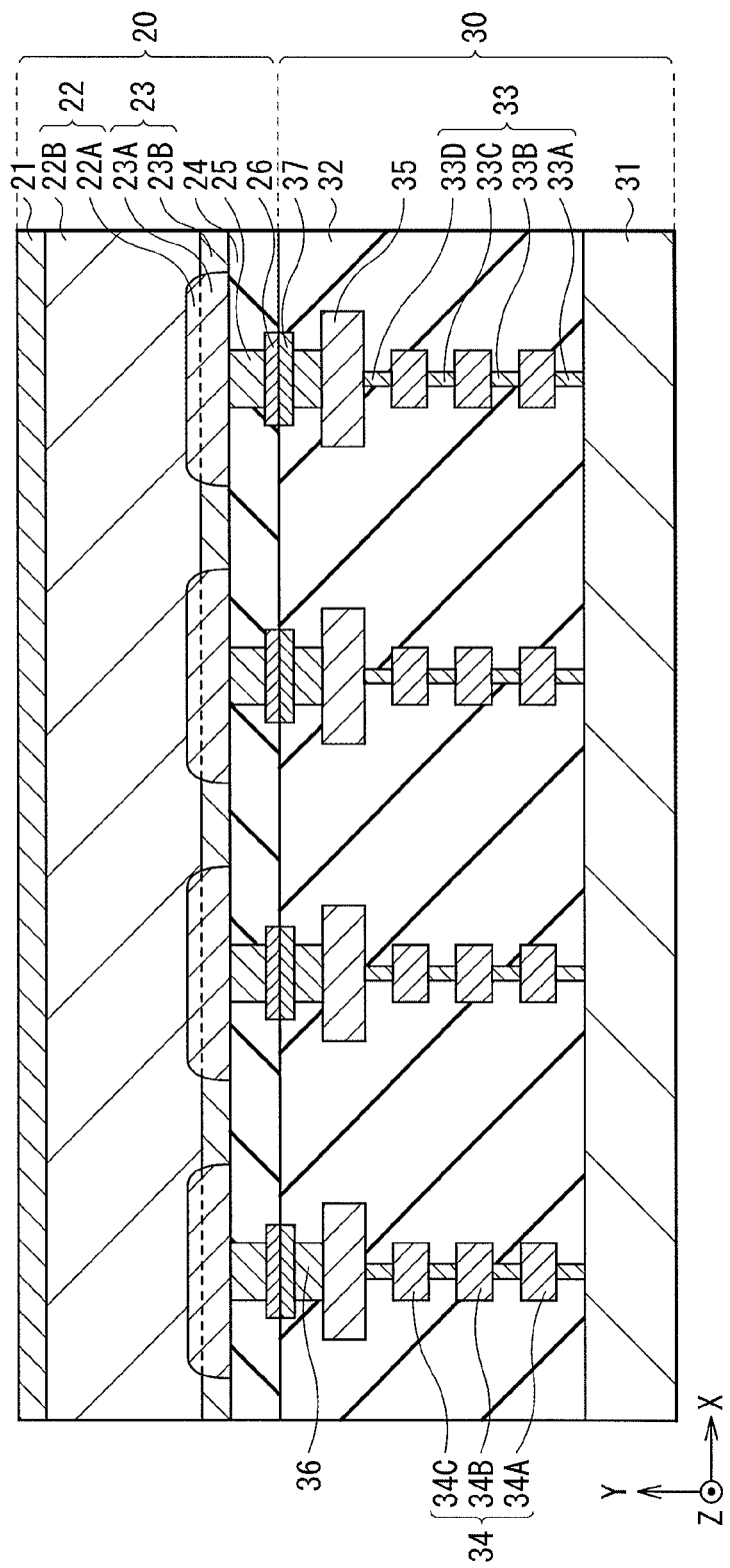
[ FIG. 5D ]

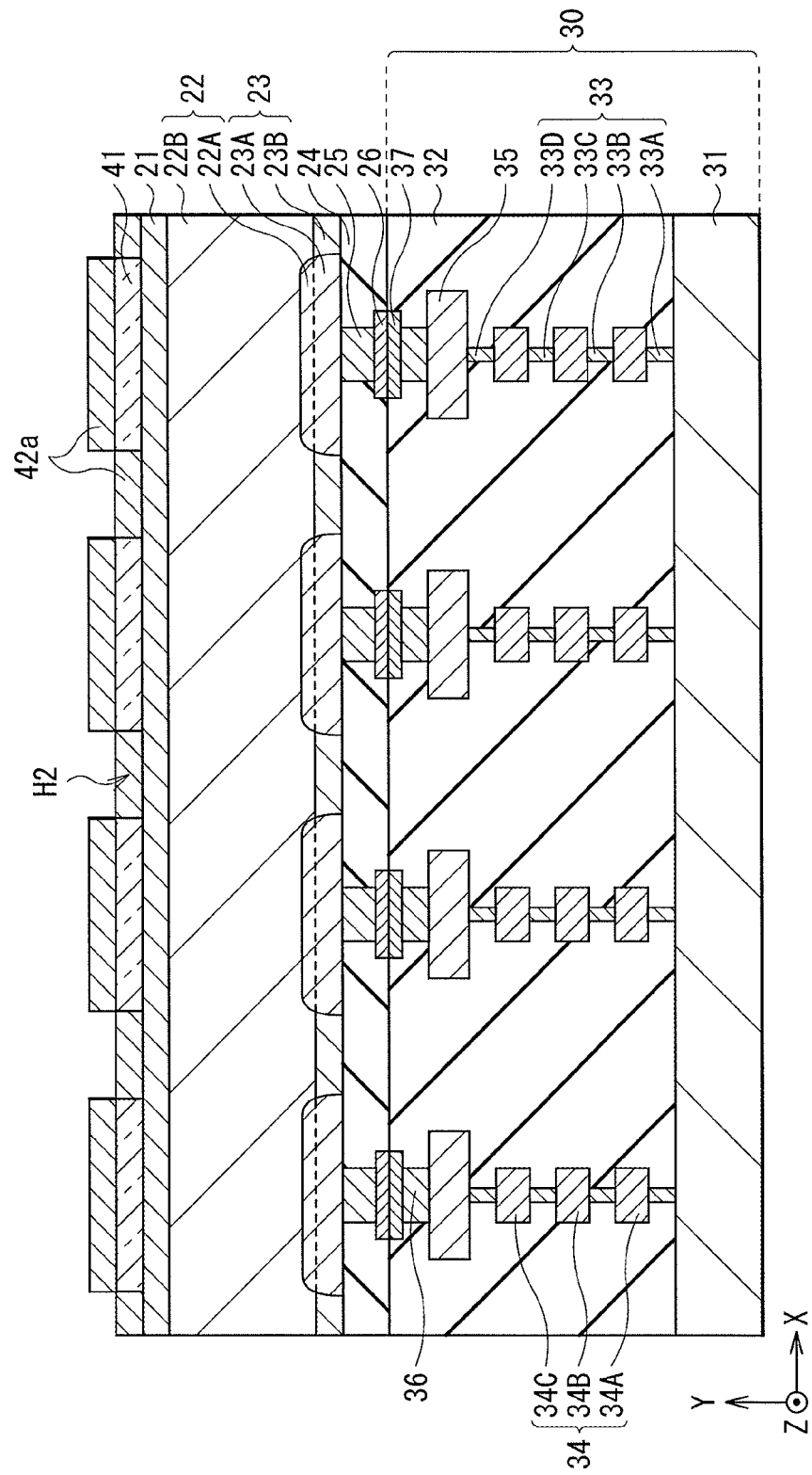
[FIG. 5E]

[ FIG. 6 ]
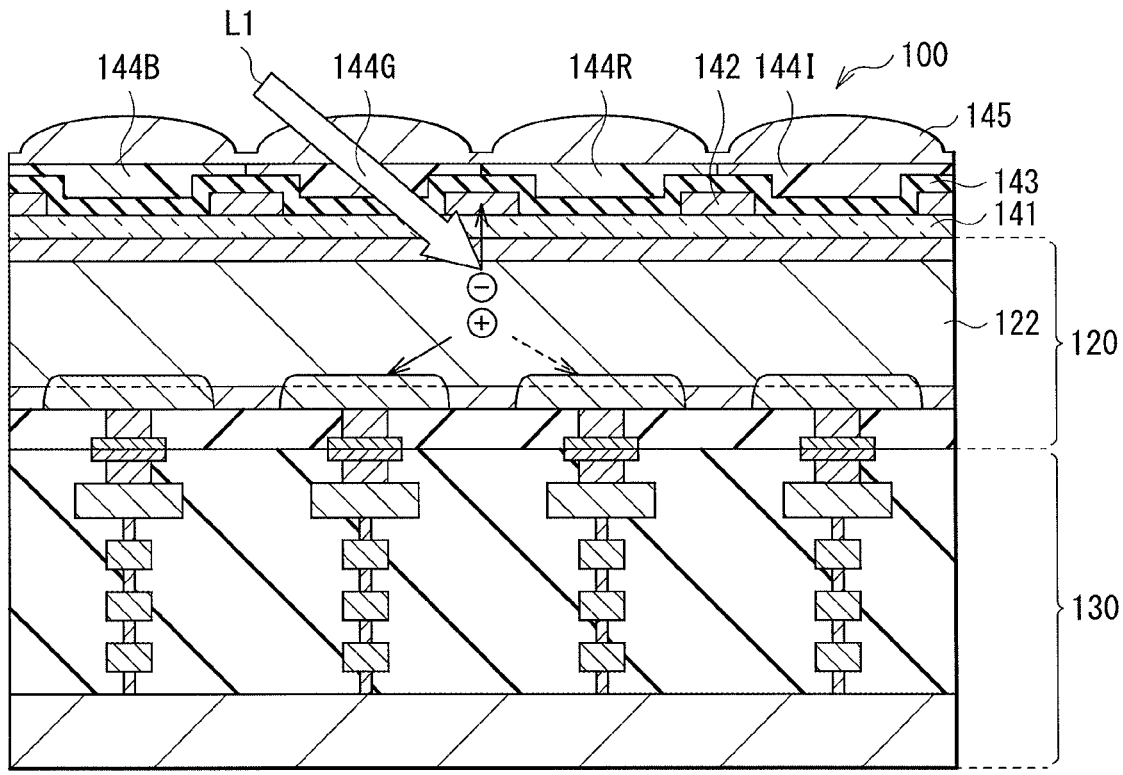
[ FIG. 7 ]
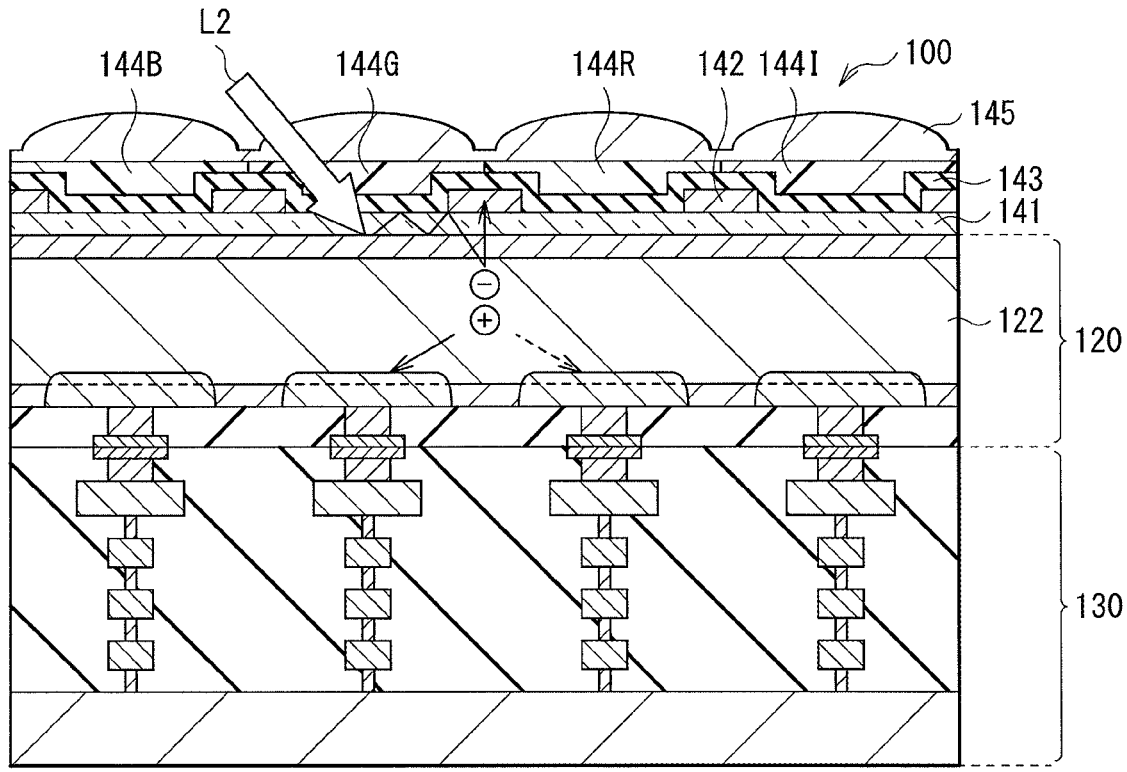

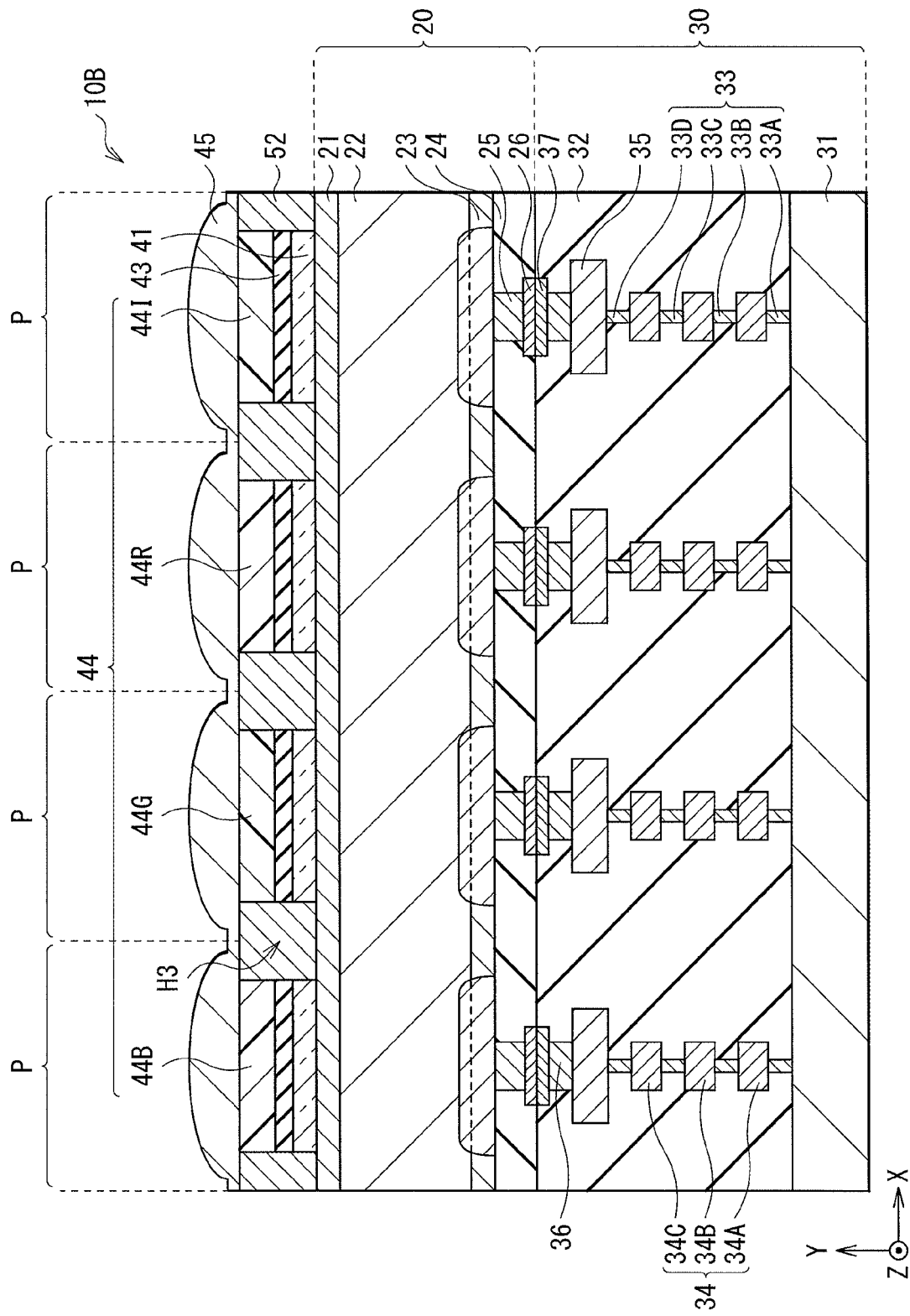
[FIG. 8]

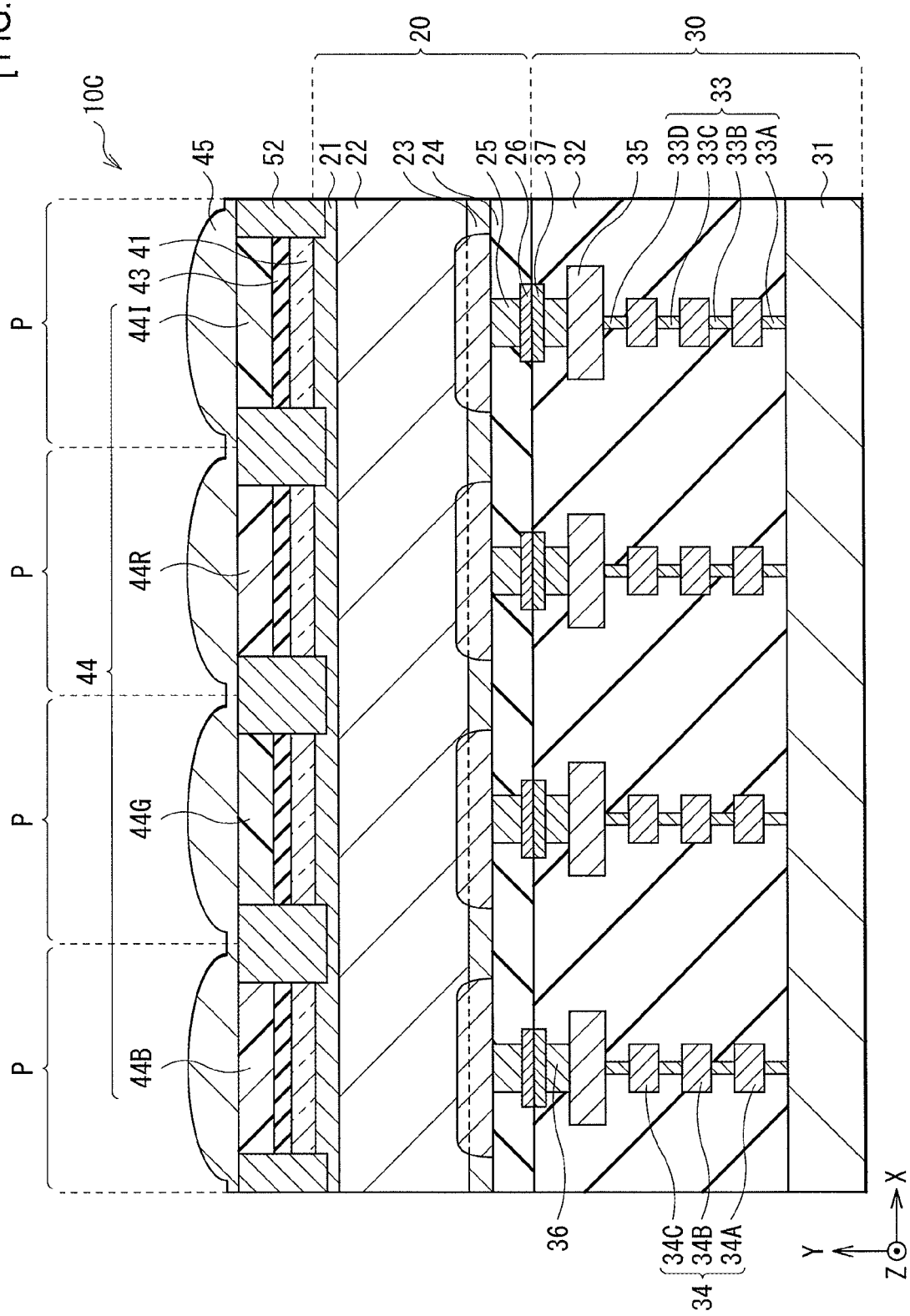

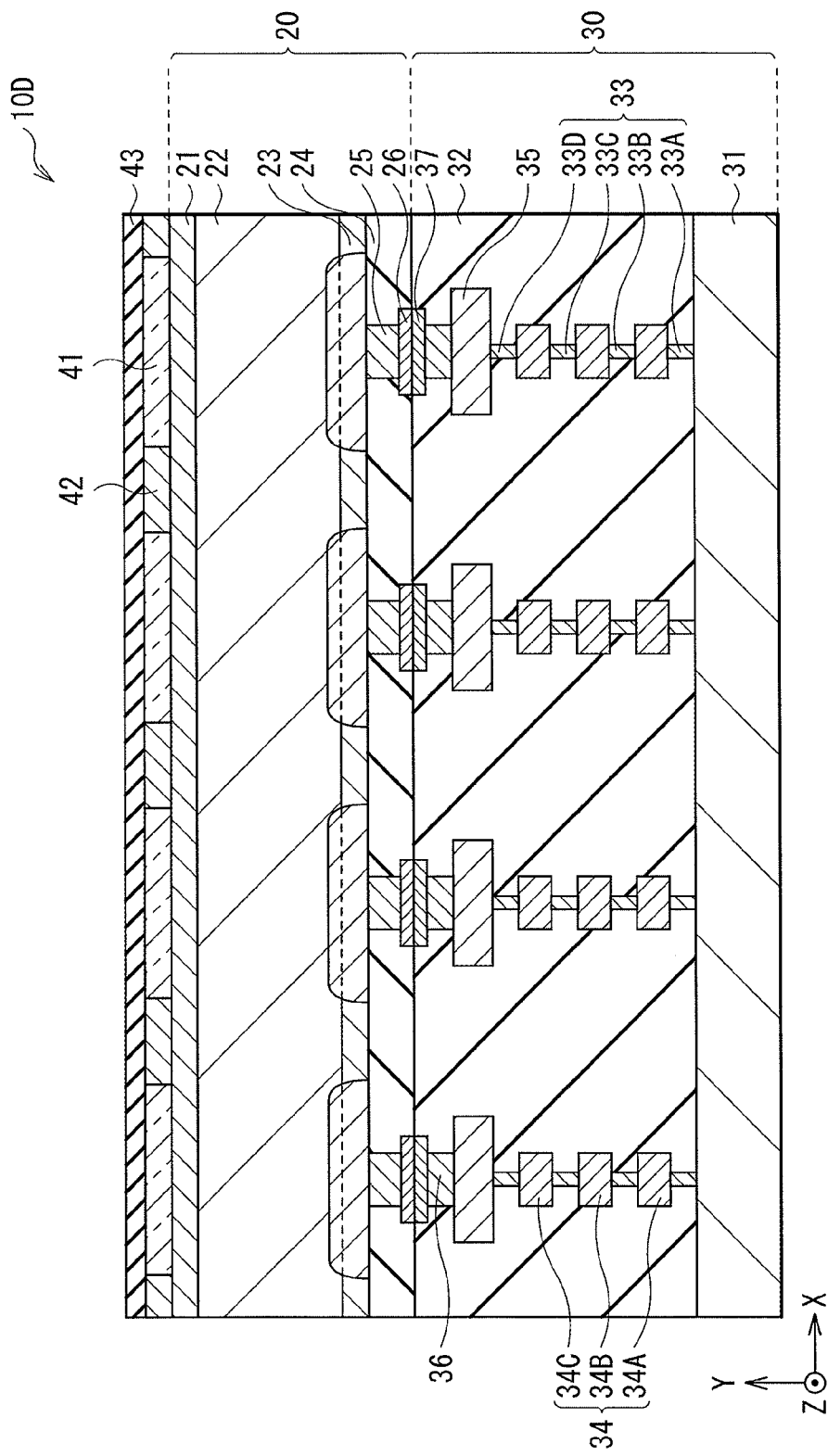
[FIG. 10]

[ FIG. 11 ]
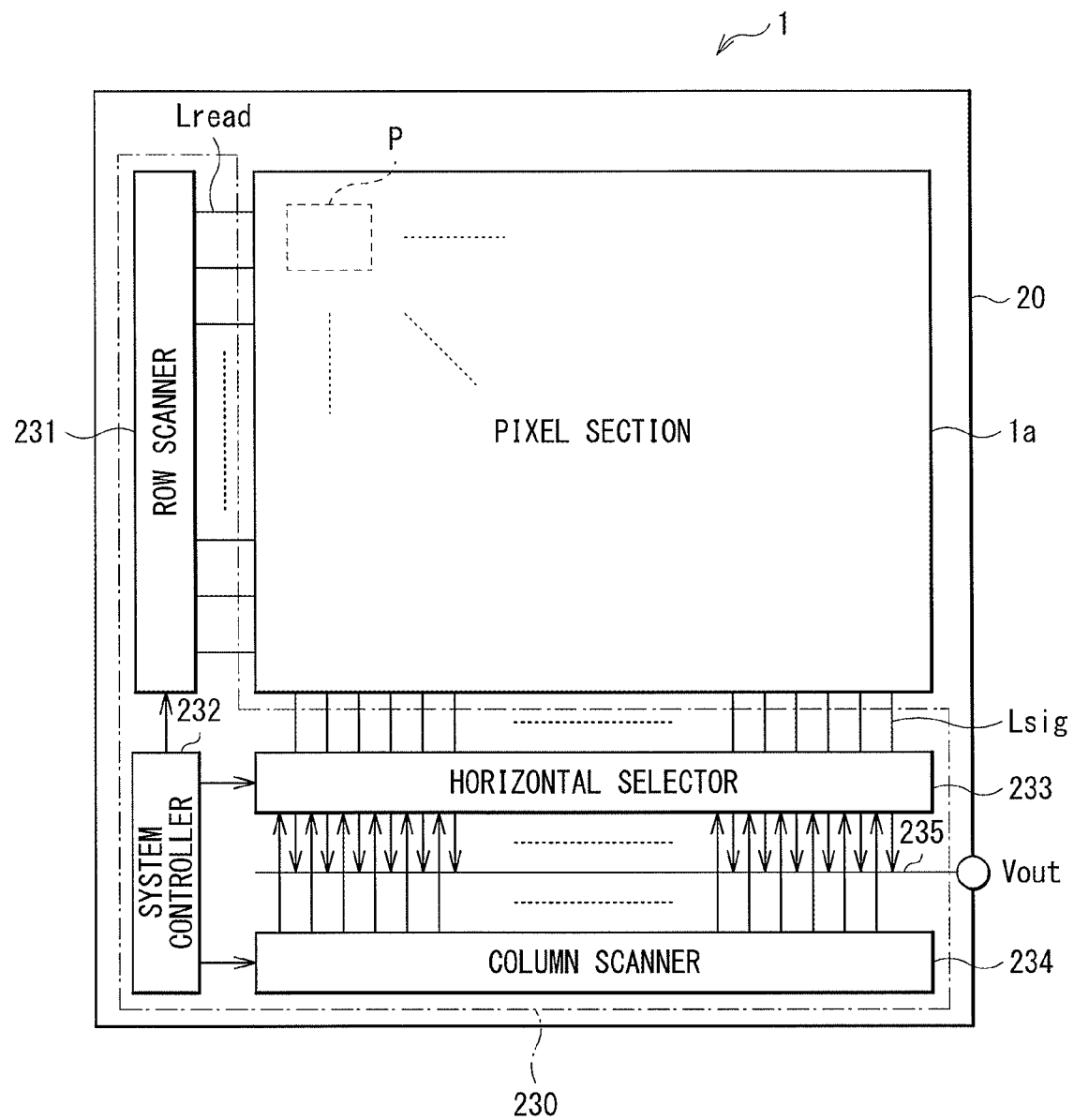

[ FIG. 12 ]
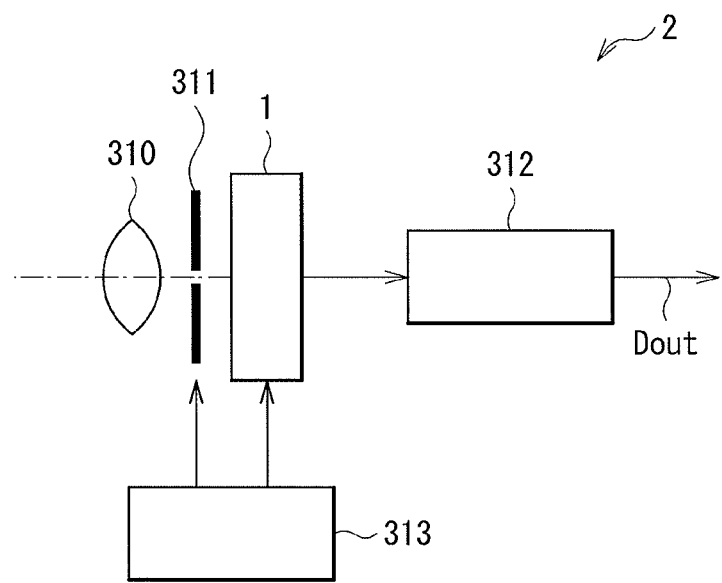

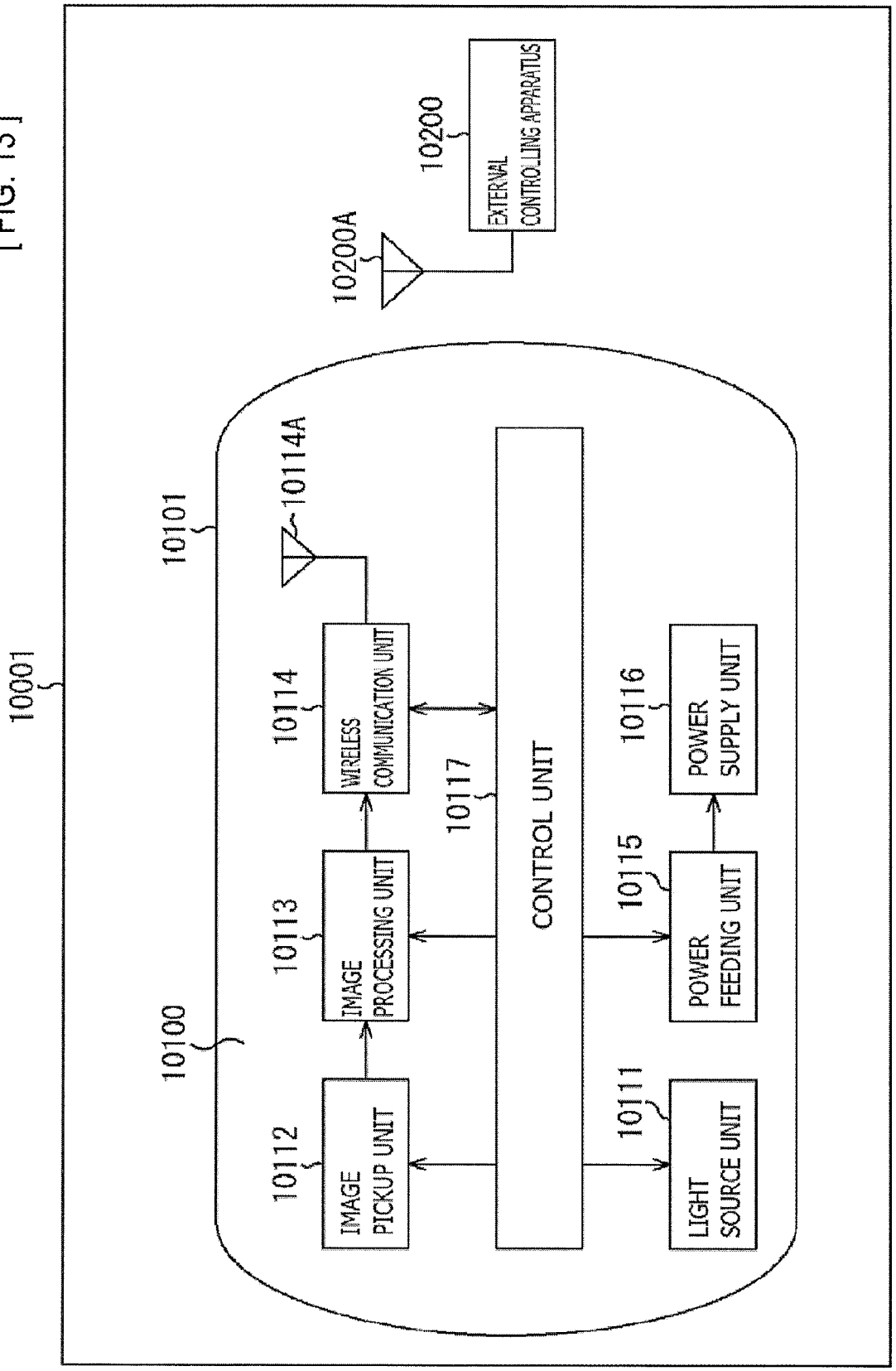

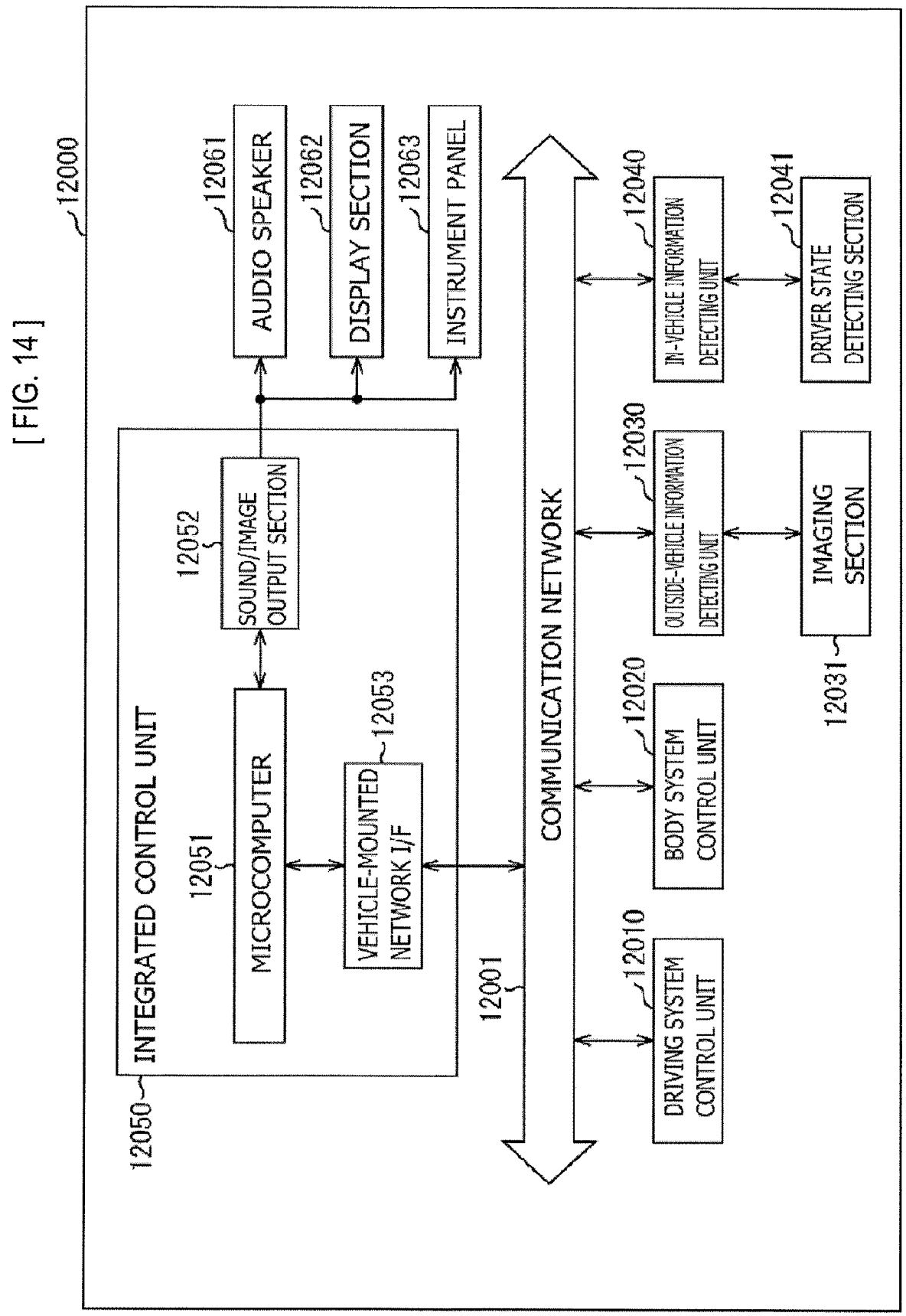

[ FIG. 15 ]
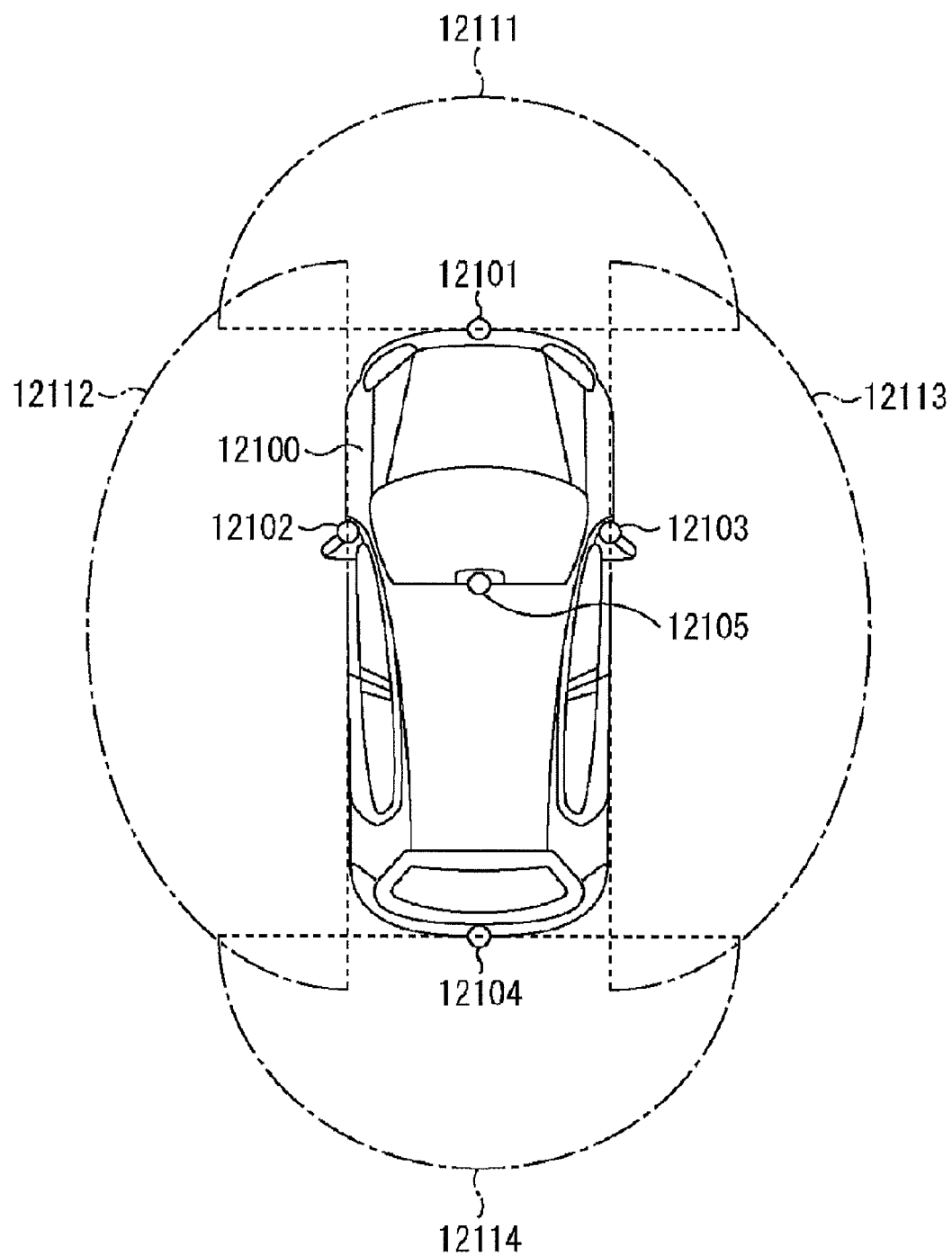

LIGHT RECEIVING ELEMENT, METHOD OF MANUFACTURING LIGHT RECEIVING ELEMENT, IMAGING DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2017/019731 having an international filing date of 26 May 2017, which designated the United States, which PCT application claimed the benefit of Japanese Patent Application No. 2016-142826 filed 20 Jul. 2016, the entire disclosures of each of which are incorporated herein by reference.

TECHNICAL FIELD

The present disclosure relates to a light receiving element to be used, for example, for an infrared sensor, etc. and a method of manufacturing the same, as well as an imaging device and an electronic apparatus.

BACKGROUND ART

For a solid-state imaging device such as a CMOS (Complementary Metal Oxide Semiconductor) image sensor including a light receiving element that absorbs wavelengths varying among pixels and photoelectrically converts the wavelengths, a structure has been developed that blocks a component of obliquely incident light in order to prevent occurrence of color mixture. For example, in a photoelectric conversion device described in PTL 1, there is disclosed a structure in which a light-shielding layer is disposed around each pixel, on a transparent electrode layer provided on a compound semiconductor layer.

CITATION LIST

Patent Literature

PTL 1: Japanese Unexamined Patent Application Publication No. 2014-60380

SUMMARY OF THE INVENTION

Incidentally, in recent years, in solid-state imaging devices, pixel size has been reduced, and it has been desired to further suppress occurrence of color mixture.

It is desirable to provide a light receiving element that makes it possible to suppress occurrence of color mixture, a method of manufacturing the light receiving element, an imagine device, and an electronic apparatus.

A light receiving element according to an embodiment of the present disclosure includes; a plurality of pixels; a photoelectric conversion layer common to the plurality of pixels: a first electrode layer provided on side of a light incident surface of the photoelectric conversion layer; and a light-shielding section embedded between the plurality of pixels adjacent to each other of the first electrode layer.

A method of manufacturing a light receiving element according to an embodiment of the present disclosure includes: forming a photoelectric conversion layer common to a plurality of pixels; forming a first electrode layer on side of a light incident surface of the photoelectric conversion layer; and forming a light-shielding section embedded between the plurality of pixels adjacent to each other of the first electrode layer.

In the light receiving element and the method of manufacturing the light receiving element according to the respective embodiments of the present disclosure, embedding the light-shielding section between the pixels adjacent to each other of the first electrode layer provided on the side of the light incident surface makes it possible to reduce incidence of oblique incident light on an adjacent pixel.

An imaging device according to an embodiment of the present disclosure includes: a plurality of pixels; a photoelectric conversion layer common to the plurality of pixels; a first electrode layer provided on side of a light incident surface of the photoelectric conversion layer; and a light-shielding section embedded between the plurality of pixels adjacent to each other of the first electrode layer.

An electronic apparatus according to an embodiment of the present disclosure includes the above-described imaging device according to the embodiment of the present disclosure.

According to the light receiving element, the method of manufacturing the light receiving element, the imaging device, and the electronic apparatus of the respective embodiments of the present disclosure, the light-shielding section is embedded between the pixels adjacent to each other of the first electrode layer provided on the side of the light incident surface of the photoelectric conversion layer, thus reducing incidence of oblique incident light on an adjacent pixel. It is therefore possible to suppress occurrence of color mixture.

It is to be noted that the above description refers to examples of the present disclosure. Effects of the present disclosure are not limited to those described above, and may be other different effects or may further include other effects.

BRIEF DESCRIPTION OF DRAWINGS

FIG. 1 is a schematic cross-sectional view of a configuration of a light receiving element according to an embodiment of the present disclosure.

FIG. 2A is a schematic view of a planar shape of a transparent electrode illustrated in FIG. 1.

FIG. 2B is a schematic view of a planar shape of the transparent electrode illustrated in FIG. 1.

FIG. 2C is a schematic view of a planar shape of the transparent electrode illustrated in FIG. 1.

FIG. 2D is a schematic view of a planar shape of the transparent electrode illustrated in FIG. 1.

FIG. 2E is a schematic view of a planar shape of the transparent electrode illustrated in FIG. 1.

FIG. 2F is a schematic view of a planar shape of the transparent electrode illustrated in FIG. 1.

FIG. 2G is a schematic view of a planar shape of the transparent electrode illustrated in FIG. 1.

FIG. 3 is a schematic view or a planar shape of the transparent electrode illustrated in FIG. 1.

FIG. 4A is an enlarged cross-sectional view of an example of a cross-sectional shape of a light-shielding section illustrated in FIG. 1.

FIG. 4B is an enlarged cross-sectional view of another example of the cross-sectional shape of the light-shielding section illustrated in FIG. 1.

FIG. 4C is an enlarged cross-sectional view of another example of the cross-sectional shape of the light-shielding section illustrated in FIG. 1.

FIG. 4D is an enlarged cross-sectional view of another example of the cross-sectional shape of the light shielding section illustrated in FIG. 1.

FIG. 5A is a cross-sectional view for description of one process of a method of manufacturing the light receiving element illustrated in FIG. 1.

FIG. 5B is a cross-sectional view of a process following FIG. 5A.

FIG. 5C is a cross-sectional view of a process following FIG. 5B.

FIG. 5D is a cross-sectional view of as process following, FIG. 5C.

FIG. 5E is a cross-sectional view of a process following FIG. 5D.

FIG. 6 is a schematic cross-sectional view for description of an example of occurrence of color mixture in a light receiving element according to a comparative example.

FIG. 7 is a schematic cross-sectional view for description of another example of occurrence of the color mixture in the light receiving element according to the comparative example.

FIG. 8 is a schematic cross-sectional view of an example of a configuration of a light receiving element according to a modification example of the present disclosure.

FIG. 9 is a schematic cross-sectional view of another example of the configuration of the light receiving element according to the modification example of the present disclosure.

FIG. 10 is a schematic cross-sectional view of another example of the configuration of the light receiving element according to the modification example of the present disclosure.

FIG. 11 is a block diagram illustrating a configuration of an imaging device.

FIG. 12 is a functional block diagram illustrating an example of an electronic apparatus (a camera) using the imaging device illustrated in FIG. 11.

FIG. 13 is a block diagram depicting an example of a schematic configuration of an in-vivo information acquisition system.

FIG. 14 is a block diagram depicting an example of schematic configuration of a vehicle control system.

FIG. 15 is a diagram of assistance in explaining an example of an installation position of an imaging section.

MODES FOR CARRYING OUT THE INVENTION

Some embodiments of the present disclosure are described below in detail with reference to the drawings. It is to be noted that the description is given in the following order.

1. Embodiment (An example of a light receiving element in which a light-shielding section is embedded between transparent electrodes provided for respective pixels)
   1-1. Configuration of Light Receiving Element
   1-2. Method of Manufacturing Light Receiving Element
   1-3. Workings and Effects
2. Modification Examples
3. Application Examples
   Application Example 1 (An example of an imaging device)
   Application Example 2 (An example of an electronic apparatus)
   Application Example 3 (An example of an in-vivo information acquisition system)
   Application Example 4 (An example of a mobile body control system)

1. Embodiment

FIG. 1 illustrates a cross-sectional configuration of a light receiving element to light receiving element 10A) of an embodiment of the present disclosure. The light receiving element 10A includes a plurality of light receiving unit regions (defined as pixels P) arranged, for example, two-dimensionally, and has, for example, a photoelectric conversion function for a wavelength in a visible region (e.g., in a range from 380 nm to 780 nm) to a short infrared region (e.g., in a range from 780 nm to 2,400 nm). This light receiving element 10A is applied, for example, to an infrared sensor, etc.

1-1. Configuration of Light Receiving Element

The light receiving element 10A has a configuration in which, for example, a photoelectric conversion layer 22 and a cap layer 23 (a second semiconductor layer) are laminated in this order, on side of one surface of a substrate 21 (a first semiconductor layer) (i.e., on side of a surface (a back surface S2) opposite to a light incident surface S1). On the cap layer 23, a protective layer 24 is further provided. Inside this protective layer 24, there is provided a contact electrode 25 (a second electrode) electrically coupled to a selective region (a first conductivity-type region 23A) of the cap layer 23. A part from this substrate 21 to the protective layer 24 including the contact electrode 25 is defined as a semiconductor substrate 20. On side of the light incident surface S1 of the substrate 21, there are provided a plurality of transparent electrodes (a first electrode layer) 41 formed to be separated for the respective pixels P, and a light-shielding section 42 is embedded between the plurality of transparent electrodes 41. On the transparent electrodes 41 and the light-shielding section 42, a protective layer 43 is provided. Further, a color filter 44 and an on-chip lens (a condensing lens) 45 are laminated in this order with this protective layer 43 interposed therebetween. Furthermore, a multilayer wiring hoard 30 having a readout circuit is joined to the semiconductor substrate 20 on side of the back surface S2. A configuration of each section is described below.

The substrate 21 is configured by, for example, an III-V group semiconductor of n-type or i-type (an intrinsic semiconductor). In this example, the photoelectric conversion layer 22 is formed in contact with the substrate 21 on the side of the back surface S2, but any other layer may be interposed between the substrate 21 and the Photoelectric conversion layer 22. Examples of a material of the layer interposed between the substrate 21 and the photoelectric conversion layer 22 include a compound semiconductor such as InAlAs, Ge, Si, GaAs, InP, InGaAsP, and AlGaAs. However, it is desirable to select a material, that lattice-matches between the substrate 21 and the photoelectric conversion layer 22.

The photoelectric conversion layer 22 includes, for example, a compound semiconductor that absorbs a wavelength in an infrared region (hereinafter referred to as an infrared ray) and, that generates electric Charges (electrons and holes), in this example, the photoelectric conversion layer 22 is provided continuously on the substrate 21, as a layer common to the plurality of pixels P (or to a plurality of contact electrodes 25).

The compound semiconductor to be used for the photoelectric conversion layer 22 is, for example, an III-V group semiconductor, and examples of which include $In_xGa_{(1-x)}As$ (x: 0<x≤1). However, it is desirable that x≥0.4 hold true to obtain higher sensitivity is the infrared region. An example of a composition of the compound semiconductor of the photoelectric conversion layer 22 that lattice-matches with the substrate 21 made of InP is $In_{0.53}Ga_{0.53}Ga_{0.47}As$.

The photoelectric conversion layer 22 involves a p-n junction or a p-i-n junction, owing to lamination of a first conductivity-type region 22A described later and a region other than this first conductivity-type region 22A (a second conductivity-type region 22B). The second conductivity-type region 2B formed inside, the photoelectric conversion layer 22 is, for example, a region including an n-type impurity. Examples of the n-type impurity include silicon (Si). However, this second conductivity-type region 22B may be configured by an intrinsic semiconductor (may be i-type semiconductor region).

The cap layer 23 is provided between the photoelectric conversion layer 22 and the protective layer 24 that is provided to contact electrode 25. As described later in detail, it is desirable that this cap layer 23 serve to electrically separate pixels or to suppress generation of a dark current. It is desirable that the cap layer 23 include a compound semiconductor having a larger band gap than that of the photoelectric conversion layer 22. Examples of the compound semiconductor having the larger band gap than that of $In_{0.53}Ga_{0.47}As$ (a band of 0.74 eV) include InP (a band gap of 1.34 eV) and InAlAs. It is to be noted that, for example, a layer made of a semiconductor of any of InAlAs, Ge, Si, GaAs, InP, may be further interposed between the cap layer 23 and the photoelectric conversion layer 22.

The first conductivity-type region 23A is formed in a selective region of the cap layer 23. This first conductivity-type region 23A is formed for each of the pixels P. In other words, a plurality of first conductivity-type regions 23A are formed discrete from one another in the cap layer 23.

The first conductivity-type region 23A is, for example, a region including a p-type impurity (a p-type impurity region). Examples of the p-type impurity include zinc (Zn). This first conductivity-type region 23A extends from side of a surface, of the cap layer 23, facing the multilayer wiring board 30 to a predetermined depth position, for example, partially to an inside of the photoelectric conversion layer 22, as illustrated in FIG. 1. This first conductivity-type region 23A formed inside the cap layer 23 is the above-described first conductivity-type region 22A inside the photoelectric conversion layer 22. A second conductivity-type region 23B is formed around the first conductivity-type region 23A to be adjacent to the first conductivity-type region 23A. It is to be noted that the p-type impurity region forming the first conductivity-type region 23A does not necessarily extend to the photoelectric conversion layer 22. A boundary of the p-type impurity region may be coincident with an interface between the cap layer 23 and the photoelectric conversion layer 22, or may be formed inside the cap layer 23.

In the cap layer 23, a p-n junction interface is formed by a boundary between the first conductivity-type region 23A and the second conductivity-type region 23B, i.e., by formation of the first conductivity-type region 23A and the second conductivity-type region 23B to be adjacent to each other in a lateral direction. This electrically separates the pixels P adjacent to one another.

The protective layer 24 is formed on the cap layer 23, and is formed using an inorganic insulating material. Examples of the inorganic insulating material include silicon nitride (SiN), aluminum oxide ($Al_2O_3$), silicon oxide ($SiO_2$), and hafnium oxide ($HfO_2$). The protective layer 24 includes at least one of these materials. The protective layer 24 has an opening H1 (see FIG. 5B) at a position facing the first conductivity-type region 23A of the cap layer 23. In other words, the first conductivity-type region 23A and the opening H1 are provided for each of the pixels P.

The contact electrode 25 is an electrode to be supplied with a voltage to read out electric charges (e.g., holes) generated in the photoelectric conversion layer 22, and is formed for each of the pixels P. Examples of a constituent material of this contact electrode 25 include a simple substance of any of titanium (Ti), tungsten (W), titanium nitride (TiN), platinum (Pt), gold (Au), germanium (Ge), palladium (Pd), zinc (Zn), nickel (Ni), and aluminum (Al), and an alloy including at least one of those materials. The contact electrode 25 may be a single layer film of the above-described constituent material, or may be formed, for example, as a laminated film in which two or more types thereof are combined.

The contact electrode 25 is embedded in the opening H1, and is electrically coupled to the first conductivity-type region 22A of the photoelectric conversion layer 22 through the first conductivity-type region 23A. In this example, the contact electrode 25 fills the opening H1, and is in direct contact with a surface of the first conductivity-type region 23A. Further, although the contact electrode 25 is provided for each of the pixels P, one contact electrode 25 may be disposed for one pixel P as in the present embodiment. Alternatively, a plurality of contact electrodes 25 may be disposed for one pixel P. Furthermore, in a case where the plurality of contact electrodes 25 are disposed for the one pixel P, some of these may include an electrode (a dummy electrode) that does not actually contribute to extraction of electric charges.

On the contact electrode 25, for example, a coupling layer 26 protruding (overhanging) in an X-axis direction is provided beyond a side surface of the opening H1. In other words, the coupling layer 26 is formed to have a canopy shape over the contact electrode 25. This coupling layer 26 electrically couples the contact electrode 25 and a readout electrode 36.

The multilayer wiring board 30 is provided with, for example, an interlayer insulating layer 32 on a supporting substrate 31 made of Si, and the readout circuit to perform signal readout from each of the pixels P is formed with this interlayer insulating layer 32 interposed therebetween. This readout circuit is configured by, for example, a pixel circuit 35 and a wiring layer 34 including various wiring lines 34A, 34B, and 34C. The pixel circuit 35 and the various wiring lines 34A, 34B, and 34C are electrically coupled together by electrodes 33A, 33B, 33C, and 33D. The readout electrode 36 is provided on the pixel circuit 35, and is electrically coupled to the pixel circuit 35. On the readout electrode 36, for example, a coupling layer 37 is formed to have a canopy shape, as with the contact electrode 25. The readout electrode 36 is electrically coupled to the contact electrode 25 by bonding this coupling layer 37 and the coupling layer 26 on side of the semiconductor substrate 20 together. This enables electric charges (e.g., holes) generated in the photoelectric conversion layer 22 to be read out from each of the pixels P.

The transparent electrodes 41 are formed individually for the respective pixels P, on the light incident surface S1 of the substrate 21. The transparent electrode 41 is electrically coupled to the substrate 21. In the light receiving element 10A of the present embodiment, in a case where, for example, holes are read out as a signal charge through the contact electrode 25, among electric charges generated in the photoelectric conversion layer 22, for example, electrons are discharged through this transparent electrode 41.

A planar shape of the transparent electrode 41 provided for each of the pixels P is not limited in particular. The planar shape of the transparent electrode 41 may be, for example, rectangular as illustrated in FIG. 2A, or may be a shape formed b turning the transparent electrode 41 illustrated in FIG. 2A by 45 degrees, as illustrated in FIG. 2B. Further, the transparent electrode 41 is not necessarily a solid film formed uniformly for each of the pixels P; for example, a plurality of slits 41A may be formed as illustrated in FIGS. 2C to 2G. By thus forming the plurality of slits 41A in a plane, it becomes possible to use the transparent electrode 41 as an electrode for a polarized light sensor. It is to be noted that, as for a width is pitch; W1) of each of the slits 41A and an electrode width (a line width; W2) between the slits 41A in a case of using the transparent electrode 31 as the electrode for the polarized light sensor, for example, the slit width W1 is 0.2 μm, and the electrode width W2 is 0.5 μm. Further, FIGS. 2C to 2G each illustrate an example in which the transparent electrode 41 is separated into a plurality of blocks b the slits 41A, but this is unit limitative. For example, as illustrated in FIG. 3, the slits 41A may be formed in the plane to leave an outer edge part of the transparent electrode 41.

Examples of a constituent material of the transparent electrode 41 include a simple substance of any of titanium (Ti), tungsten (W), titanium nitride (TiN), platinum (Pt), gold (Au), germanium (Ge), nickel (Ni), and aluminum (Al), and an alloy including at least one of these. Among them, in particular, indium-titanium oxide (ITiO) has high transparency with respect to an infrared region, and is desirable for the constituent material of the transparent electrode 41. Other than the above-described materials, examples of the material of the transparent electrode 41 include indium tin oxide (ITO), tin (Sn), tin oxide ($SnO_2$), IWO, indium-zinc complex oxide (IZO), aluminum oxide doped with zinc (AZO), gallium oxide doped with zinc (GZO), aluminum oxide doped with magnesium and zinc (AlMgZnO), indium-gallium complex oxide (IGO), In—$GaZnO_4$ (IGZO), indium oxide doped with fluorine (IFO), tin oxide doped with antimony (ATO), tin oxide doped with fluorine (FTO), zinc oxide (ZnO), ZnO doped with boron, and InSnZnO.

The light-shielding section 42 is formed to be embedded between the transparent electrodes 41 provided for the respective pixels P, i.e., between the pixels P adjacent to each other, and prevents oblique incident light from entering an adjacent pixel. A side surface S3 of the light-shielding section 42 is illustrated to be perpendicular to the semiconductor substrate 20 in FIG. 1, but tins is not limitative. For example, as illustrated in FIG. 4A, a forward tapered shape in which an angle θ formed by the semiconductor substrate 20 (the substrate 21) and the side surface S3 is an acute angle may be adopted. Alternatively, as illustrated in FIG. 4B, a reverse tapered shape in which an angle θ formed by the semiconductor substrate 20 (the substrate 21) and the side surface S3 is an obtuse angle may be adopted. Further, the side surface S3 of the light-shielding section 42 may be a curved surface. Alternatively, the side surface 3 may be, for example, convex or concave as illustrated in FIG. 4C and FIG. 4D. In particular, the light-shielding section 42 of the forward tapered shape easily takes light into the photoelectric conversion layer 22, and allows for an improvement in utilization efficiency of light and is therefore preferable.

It is to be noted that a width W3 of the light-shielding section 42 in the X-axis direction may be sufficient when light blocking characteristics are secured. In addition, widths may be adopted that vary among absorption wavelengths of the respective pixels P adjacent to each other.

Examples of a constituent material of the light-shielding section 42 include titanium (Ti), tungsten (W), carbon (C), chromium oxide ($Cr_2O_3$), an alloy of samarium (Sm) and silver (Ag), and an organic material. The light-shielding section 42 is configured as a single layer film or a laminated film made of these materials. Specific examples of the laminated film include a metal laminated film such as Ti/W. The light-shielding section 42 may be formed using a material including Ti, Pt, and Au, for example, besides the above-described materials.

The protective layer 43 flattens the surface of the transparent electrode 41 and the light-shielding section 42, and is formed using, for example, an inorganic insulating material, as with the protective layer 24. Examples of the inorganic insulating material include silicon nitride ($SiN_x$), silicon oxide ($SiO_x$), aluminum oxide ($Al_2O_3$), and hafnium oxide ($HfO_2$). The protective layer 43 includes one or more of these materials.

A color filter 44 is provided on the protective layer 43, and for example, any of a red filter (44R), a green filter (44G), a blue filter (44B) and an IR filler (44I) is disposed for each of the pixels P. These color filters 44 are provided in a regular color array (e.g., a Bayer array). Providing such color filters 44 makes it possible to obtain light receiving data of a wavelength corresponding to the color array in the light receiving element 10A.

An on-chip lens 45 serves to condense light toward the photoelectric conversion layer 22. Examples of a lens material include an organic material and a silicon oxide film ($SiO_2$).

1-2. Method of Manufacturing Light Receiving Element

It is possible to manufacture the light receiving element 10A as follows, for example. FIGS. 5A to 5E illustrate manufacturing processes of the light receiving element 10A in a process order.

First, as illustrated in FIG. 5A, for example, on one surface of a substrate 27 made of InP, for example, a buffer layer 28 including InP, an etching stopper layer 29 including InGaAs, a window layer 21a including InP that serves as the above-mentioned substrate 21, an absorption layer 22a made of InGaAs that serves as the photoelectric conversion layer 22, and a diffusion layer 23a including InP that serves as the cap layer 23 are epitaxially grown sequentially, using, for example, an organic metal chemical vapor deposition method (MOCVD: Metal Organic Chemical Vapor Deposition). In this growth process, the window layer 21a, the absorption layer 22a, and the diffusion layer 23a are each formed as an n-type layer, by introducing gas, etc., including an n-type impurity, for example.

It is to be noted that a film formation method other than the MOCVD may be used. Examples thereof include MBE (Molecular Beam Epitaxy), a hydride vapor phase epitaxy method (HVPE method) in which halogen contributes to transportation or reaction, an atomic layer deposition method (an ALD method, an Atomic Layer Deposition method), a migration enhanced epitaxy (MEE) method, and a plasma-assisted physical vapor deposition method (a PPD method). Further, in the present embodiment, the buffer layer 28 and the etching stopper layer 29 are provided in this order between the substrate 27 and the window layer 21a. However, forming the buffer layer 28 as a layer including InGaAs enables the buffer layer 28 layer to also serve as an etching stopper layer, thus making it possible to simplify the manufacturing process.

Subsequently, as illustrated in FIG. 5B, the protective layer 24 is formed on the diffusion layer 23a. Specifically, the protective layer 24 made of the above-described material is first formed by, for example, a plasma CVD (Chemical Vapor Deposition) method, a heat CVD method, an ALD (Atomic Layer Deposition) method, or a sputtering method, etc. A thickness of the protective layer 24 is not limited in particular, and is, for example, in a range from 50 nm to 100 nm. Thereafter, as also illustrated in FIG. 5B, the opening H1 is formed in the protective layer 24, by etching using a lithographic method. The opening H1 is formed for each pixel formation region (a region where the pixel P is to be formed).

Next, as also illustrated in FIG. 5B, for example, a p-type impurity (e.g., zinc (Zn)) is diffused for the diffusion layer 23a and the absorption layer 22a by, for example, vapor phase diffusion, using the protective layer 24 as a mask (through the opening H1). At this time, for example, gas such as DMZn (Di-Methyl Zinc) is used, and a process temperature at that time is allowed to be, for example, about 500° C. A diffusion region (the first conductivity-type region 23A and the first conductivity-type region 22A) of Zn spreading through the diffusion layer 23a and the absorption layer 22a is thereby formed. It is to be noted that a part of the diffusion layer 23a excluding the first conductivity-type region 23A serves as the second conductivity-type region 23B. A part of the absorption layer 22a excluding the first conductivity-type region 22A serves as the second conductivity-type region 22B. In other words, the photoelectric conversion layer 22 including the first conductivity-type region 22A and the second conductivity-type region 22B, and the cap layer 23 including the first conductivity-type region 23A and the second conductivity-type region 23B are formed. It is to be noted that the first conductivity-type region 23A and the first conductivity-type region 22A may be formed by, for example, solid phase diffusion or ion implantation, besides the vapor phase diffusion.

Subsequently, as also illustrated in FIG. 5B, the contact electrode 25 and the coupling layer 26 are formed. Specifically, as the contact electrode 25, for example, a laminated film of Ti/W is formed to fill the opening H1 by, for example, a CVD method, a PVD (Physical Vapor Deposition) method, an ALD method, or a vapor deposition method, etc., and then patterned by etching using a lithographic method. The Ti/W subjected to resist opening by a dry process is thereby etched, and the contact electrode 25 is formed. Next, for example, a Cu film is formed using, for example, a vapor deposition method, a PVD method, or a plating method, etc. and then, a surface of the Cu film is polished by, for example, a CMP method. The contact electrode 25 and the coupling layer 26 are thereby formed for each of the pixels P.

It is to be noted that, here, the example is described in which the first conductivity-type region 23A is formed using the vapor phase diffusion for each of the pixels P, but this is not limitative. For example, forming the diffusion layer 23a beforehand using a p-type semiconductor by epitaxial or vapor phase diffusion makes it possible to form the first conductivity-type region 23A for each of the pixels by using, for example, a wet process.

Next, as illustrated in FIG. 5C, the multilayer wiring board 30 having been separately thrilled is jointed to the semiconductor substrate 20. Specifically, the coupling layer 26 on the side of the semiconductor substrate 20 and the coupling layer 37 on side of the multilayer wiring board 30 are subjected to metal bonding to be electrically coupled to each other. Examples of a metal bonding method include plasma bonding, ambient temperature bonding, and thermal diffusion bonding. Alternatively, coupling by a bump may also be adopted.

It is to be noted that the coupling layer 26 provided on the side of the semiconductor substrate 20 may have a damascene structure. In addition, the coupling layer 37 provided on the side of the multilayer wiring board 30 may also have a damascene structure. Joining the semiconductor substrate 20 and the multilayer wiring board 30 together may be based on a dual structure that bonds together the coupling, layer 26 and the coupling layer 37 formed to have the damascene structure. Alternatively, a single structure that bonds together the contact electrode 25 and the coupling layer 37 may be adopted by omitting the coupling layer 26.

Next, as illustrated in FIG. 5C, the multilayer wiring board 30 having been separately formed is jointed to the semiconductor substrate 20. Specifically, the coupling layer 26 on the side of the semiconductor substrate 20 and the coupling layer 37 on side of the multilayer wiring board 30 are subjected to metal bonding to be electrically coupled to each other. Examples of a metal bonding method include plasma bonding, ambient temperature bonding, and thermal diffusion bonding. Alternatively, coupling by a bump may also be adopted.

Subsequently, as illustrated in FIG. 5D, the substrate 27, the buffer layer 28, and the etching stopper layer 29 are removed, and thereby the window layer 21a that serves as the substrate 21 is exposed. Specifically, the substrate 27 and the buffer layer 28 are removed by, for example, grinding, or wet etching using, for example, a solution in which hydrochloric acid, acetic acid, and water are sequentially mixed at a proportion of 1:1:2. Next, for example, the etching stopper layer 29 is removed by wet etching using a solution in which citric acid, hydrogen peroxide, and water are sequentially mixed at a proportion of 5 g:30 cc:500 cc. However, such a wet process is not limitative, and a dry process (dry etching) may also be used.

Subsequently, as illustrated in FIG. 5E, the transparent electrode 41 is formed on the side of the light incident surface S1 of the substrate 21. Specifically, for example, an ITiO film having a thickness of 50 nm is limited by, for example, an RF (radio-frequency) sputtering method and then, for example, an open in having the width W3 of 50 μm is provided in a predetermined region (specifically, between the pixels P) the ITiO film by dry etching, followed by patterning the transparent electrode 41 is thereby formed for each of the pixels P. It is to be noted that, besides the above-described method, for example, a resist pattern may be used to form the transparent electrode 41. Next, as also illustrated in FIG. 5E, a metal film 42A, in which Ti (e.g., having a thickness of 10 nm) and W (e.g., having a thickness of 40 nm) are laminated on, the entire surface on the substrate 21 and the transparent electrode 41, is formed by, for example, an RF sputtering method.

Subsequently, the metal film 42A on the transparent electrode 41 is selectively removed by dry etching or a CMP method. The light-shielding section 42 embedded between the transparent electrodes 41 formed for the respective pixels P is thereby formed. Finally, the protective layer 43, the color filter 44, and the on-chip lens 45 are formed in this order. The light receiving element 10A illustrated in FIG. 1 is thereby completed.

1-3. Workings and Effects

An image sensor having a photoelectric conversion function for a wavelength in a visible region to a short infrared region is configured by for example, a photoelectric conversion section made of an InGaAs material having a band gap of 0.74 eV and a Si-based readout circuit. In a light receiving element (an imaging element) having such a structure, a transparent electrode is provided on a semiconductor substrate (a photoelectric conversion section) front which an InP substrate that absorbs a visible light component is removed, and a color filter and a condensing lens are mounted on the transparent electrode.

For the solid-state imaging device including the light receiving element that absorbs wavelengths varying among pixels and photoelectrically converts the wavelengths as described above, for example, a light receiving element 100 illustrated in FIG. 6 is conceivable to block a light component that obliquely enters. In this light receiving element 100, a multilayer wiring board 130 is jointed to one surface of a semiconductor substrate 120, and a transparent electrode layer 141 is provided on a surface opposite to this one surface. A light-shielding layer 142 is disposed in a pixel peripheral part on this transparent electrode layer 141.

However, it is difficult even for the light receiving element having such a structure to prevent occurrence of color mixture. In the light receiving element 100 illustrated in FIG. 6, an electrically conductive film (the transparent electrode layer 141) having high transparency is disposed under the light-shielding layer 142. As illustrated in FIG. 6, when passing through this transparent electrode layer 141, light L1 entering at a wide angle is absorbed by a photoelectric conversion layer 122 close to an adjacent pixel due to a thickness of the transparent electrode layer 141. For this reason, photoelectric conversion occurs in proximity to the adjacent pixel, and a portion of generated electric charges is read out as a signal charge on side of the adjacent pixel, causing occurrence of color mixture. It is conceivable that the thickness of the transparent electrode layer 141 may be reduced to control this issue; however, when the thickness of the transparent electrode layer 141 is reduced, sheet resistance becomes high. This raises a new issue in which an electric potential difference occurs in a pixel plane, causing occurrence of dark current unevenness.

In addition, as for light L2 entering at a low angle as well, it is difficult to prevent occurrence of color mixture, as with the light L1 entering at a wide angle. Specifically, as illustrated in FIG. 7, the light L2 entering at a low angle causes multiple reflection inside the transparent electrode layer 141, and further, is reflected at a bottom surface of the light-shielding layer 142, and enters a proximity of a pixel adjacent to the photoelectric conversion layer 122, causing occurrence of color mixture. It is conceivable that a pixel pitch may be increased, i.e., an interval between the light-shielding layers 142 each formed between the pixels may be increased to prevent this issue. However, this is not suitable for fining, i.e., for increasing the number of pixels. Further, a diffusion length of InGaAs that is able to absorb a wavelength in a short infrared region is, for example, 10 µm to 18 µm, or longer to reach about 100 µm depending on carrier density or carrier mobility, thus causing color mixture to easily occur in association with a fine structure of pixels. For this reason, it is difficult to adopt a structure as represented by the light receiving element 100, for the light receiving element that absorbs wavelengths varying among pixels, in particular, for a light receiving element using InGaAs.

In contrast, in the present embodiment, the transparent electrode 41 is provided for each of the pixels P, and the light-shielding section 42 is embedded between the transparent electrodes 41, i.e., between the pixels P. This makes it possible to solve the above-described two issues, i.e., an issue in which the light L1 entering at a wide angle passes through to the photoelectric conversion layer in proximity to the adjacent pixel, and an issue in which the light L2 entering at a low angle causes the multiple reflection inside the transparent electrode 41.

In the present embodiment, as described above, the light-shielding section 42 is embedded between the transparent electrodes 41 provided for the respective pixels, thus making it possible to prevent the light (L1 and L2) at a wide angle and a low angle from entering the adjacent pixel. It is therefore possible to suppress occurrence of color mixture.

Further, in the present embodiment, as for occurrence of color mixture, embedding the light-shielding section 42 between the pixels P adjacent to each other as described above improves carrier density of the photoelectric conversion layer 22, and flexibility of design of a longitudinal structure including a thickness of each of layers forming the light receiving element 10A as well as flexibility of a manufacturing process.

Furthermore, in the present embodiment, it is possible to suppress occurrence of color mixture by providing the above-described structure, thus making it possible to use a material, such as ITiO, having less reflection and less absorption of a wavelength in a visible region to an infrared region, for the transparent electrode 41. This makes it possible to improve internal quantum efficiency in a wide wavelength band. Moreover, it is possible to design the transparent electrode 41 to have a sufficient thickness, thereby making it possible to suppress sheet resistance sufficiently, and thus to reduce dark current unevenness.

Further, as illustrated in FIG. 1, etc., the light-shielding section 42 is embedded between the transparent electrodes 41, and the transparent electrode 41 and the light-shielding section 42 are formed to be substantially flush with each other, thereby improving flexibility of design of optical members such as the color filter 44 and the on-chip lens 45.

It is to be noted that the opening H2 filled with the light-shielding section 42 does not necessarily penetrate the transparent electrode 41. In other words, the transparent electrode 41 may not be necessarily formed to be separated for each of the pixels P. As long as the light-shielding section 42 is embedded in at least a portion between the pixels P of the electrically conductive film (e.g., the above-described ITiO film) forming the transparent electrode 41, it is possible to reduce incidence of oblique incident light on the adjacent pixel, although light-shielding performance is inferior to that in the case where the light-shielding section 42 is embedded to separate the transparent electrodes 41 completely.

Next, modification examples of the foregoing embodiment are described. In the following, the same components as those of the foregoing embodiment are denoted by the same reference numerals, and the descriptions thereof are omitted where appropriate.

2. Modification Examples

FIG. 8 illustrates a cross-sectional configuration of a light receiving element (a light receiving element 10B) according to a modification example of the present disclosure. As with the light receiving element 10A of the foregoing embodiment, the light receiving element 10B of the present modification example includes a plurality of light receiving unit regions (defined as the pixels P) arranged, for example, two-dimensionally, and has, for example, a photoelectric, conversion function for a wavelength in a visible region (e.g., in a range from 380 nm to 780 nm) to a short infrared region (e.g., in a range from 780 nm to 2,400 nm).

As with the light receiving element 10A, the light receiving element 10B has a configuration in which, for example, the photoelectric conversion layer 22 and the cap layer 23 are laminated in this order, on the side of the back surface S2 of the substrate 21. The protective layer 24 is further provided on the cap layer 23. Inside this protective layer 24, the contact electrode 25 electrically coupled to the first conductivity-type region 23A formed in the cap layer 23 is provided. A part from this substrate 21 to the protective layer 24 including the contact electrode 25 is defined as the semiconductor substrate 20. On the side of the light incident surface S1 of the substrate 21, the plurality of transparent electrodes 41 formed to be separated for each of the pixels P are provided, and further, the color filter 44 and the on-chip lens 45 are laminated in this order with the protective layer 43 interposed therebetween. The multilayer wiring board 30 including the readout circuit is joined to the semiconductor substrate 20 on the side of the back surface S2.

However, in the present modification example, an opening H3 penetrating from the color filter 44 to the transparent electrode 41 is provided between the pixels P adjacent to each other. The present modification example is different from the foregoing embodiment in that the present modification example has a configuration in which a light-shielding section 52 is embedded in this opening H3. In other words, the light receiving element 10B includes, between the pixels P adjacent to each other, the light-shielding section 52 which separates the transparent electrode 41, the protective layer 43, and the color filter 44 for each of the pixels P. Such a configuration in the light receiving element 10 of the present modification example makes it possible to further reduce occurrence of color mixture as compared with the above-described light receiving element 10A.

It is to be noted that the light-shielding section 42 in the foregoing embodiment and the light-shielding section 52 in the modification example may be each provided between at least the pixels P adjacent to each other, and positions of an upper end and a lower end thereof are not limited. For example, as in a light receiving element 10C illustrated in FIG. 9, the lower end of the light-shielding section 52 may extend to an inside of the substrate 21. Alternatively, the lower end may extend further to the inside of the photoelectric conversion layer 22. Further, the upper end of the light-shielding section 52 may be flush with the protective layer 43, without penetrating the color filter 44.

Furthermore, in the light receiving elements 10A, 10B, and 10C, the color filter 44 and the on-chip lens 45 are provided on the protective layer 43, but the color filter 44 and the on-chip lens 45 may be omitted as in a light receiving element 10D illustrated in FIG. 10.

3. Application Examples

Application Example 1

FIG. 11 illustrates a functional configuration of an imaging device (an imaging element 1) using an element structure of the light receiving element 10A (or the light receiving element 10B, 10C, or 10D) described in the foregoing embodiment, etc. The imaging element 1 is, for example, an infrared image sensor, and includes, for example, a pixel section 1a and a peripheral circuit section 230 that drives this pixel section 1a. The peripheral circuit section 230 includes, for example, a row scanner 231, a horizontal selector 233, a column scanner 234, and a system controller 232.

The pixel section 1a includes, for example, the plurality of pixels P arranged two-dimensionally in matrix. To this pixel P, for example, a pixel driving line Lread (e.g., a row selection line and a reset control line) is wired for each of pixel rows, and a vertical signal line Lsig is wired for each of pixel columns. The pixel driving line Lread transmits a drive signal for signal readout from the pixel P. One end of the pixel driving line Lread is coupled to an output end corresponding to each row of the row scanner 231.

The row scanner 231 is a pixel driver that is configured by a shift register, an address decoder, etc., and that drives, each of the pixels P of the pixel section 1a on a row basis, for example. A signal outputted from each of the pixels P of a pixel row selected and scanned by the row scanner 231 is supplied to the horizontal selector 233 through each vertical signal line Lsig. The horizontal selector 233 is configured by an amplifier, a horizontal selection switch, etc. provided for each vertical signal line Lsig.

The column scanner 234 is configured by a shift register, an address decoder, etc., and sequentially drives respective horizontal selection switches of the horizontal selector 233 while scanning. Signals of the respective pixels transmitted through corresponding vertical signal lines Lsig are sequentially outputted to a horizontal signal line 235, through selective scanning by the column seamier 234, and are inputted to an unillustrated signal processor, etc. through the horizontal signal line 235.

The system controller 232 receives a clock provided from outside, data to command an operation mode, etc., and also outputs data such as internal information on the imaging element 1. The system controller 232 further includes a timing generator that generates various timing signals, and performs driving control of the row scanner 231, the horizontal selector 233, the column scanner 234, etc., based on the various tinting signals generated by this timing generator.

Application Example 2

The above-described imaging element 1 is applicable to various kinds of electronic apparatuses such as a camera that enables imaging of, for example, an infrared region. FIG. 12 illustrates a schematic configuration of an electronic apparatus 2 (a camera), as an example. This electronic apparatus 2 is, for example, a camera that is able to capture a still image or a moving image, and includes the imaging element 1, an optical system (an optical lens) 310, a shutter unit 311, a driver 313 that drives the imaging element 1 and the shutter unit 311, and a signal processor 312.

The optical system 310 guides image light (incident light) from a subject to the imaging element 1, fins optical system 310 may be configured by a plurality of optical lenses. The shutter unit 311 controls a light irradiation period and a light shielding period for the imaging element 1. The driver 313 controls a transfer operation of the imaging element 1 and a shutter operation of the shutter unit 311. The signal processor 312 performs various kinds of signal processing, for a signal outputted from the imaging element 1. An image signal Dout after the signal processing is stored into a storage medium such as a memory, or outputted to a monitor, etc.

Further, the light receiving element 10A (or the light receiving element 10B, 10C, or 10D) described in the present embodiment, etc. is also applicable to the following electronic apparatuses (a capsule endoscope 10100 and a mobile body such as a vehicle).

Application Example 3

Application Example to In-Vivo Information Acquisition System

FIG. 13 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation tight is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 13, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the fight source unit 10111 can be changed, for example, in accordance with a control signal from the external controlling apparatus 10200. Further, an image pickup condition (For example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to an embodiment of the present disclosure can be applied. The technology according to an embodiment of the present disclosure is applicable to, for example, the image pickup unit 10112 of the configurations described above. This makes it possible to acquire a fine operative image, thereby improving accuracy of an inspection.

Application Example 4

Application Example to Mobile Body

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, and a robot.

FIG. 14 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 14, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 14, an audio speaker 12061, a display section 12062, and an instrument panel 12063 are illustrated as the output device. The display section 12062 may, for example, include at least one of an on-board display and a head-up display.

FIG. 15 is a diagram depicting an example of the installation position of the imaging section 12031.

In FIG. 15, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 15 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the side view mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km hour), further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle, in a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound image output section 12052 controls the display section 12002 so that a square contour line for emphasis is displayed so as to be superimposed on the recognized pedestrian. The sound/image output section 12052 may also control the display section 12002 so that an icon or the like representing the pedestrian is displayed at a desired position.

An example of the vehicle control system to which the technology according to an embodiment of the present disclosure is applicable has been described above. The technology according to an embodiment of the present disclosure is applicable to, for example, the imaging section 12031, etc. of the configurations described above. The application of the technology according to an embodiment of the present disclosure to the imaging section 12031 allows for acquisition of an easily viewable captured image, thus making it possible to reduce fatigue of the driver.

Although the descriptions have been provided by way of the embodiment, modification examples, and application examples, the contents of present disclosure is not limited thereto, and may be modified in a variety of ways. For example, the layer configurations of the light receiving element 10A (or the light receiving element 10B, 10C, or 10D) described in the foregoing embodiment, etc. are merely exemplified, and may further include another layer. In addition, the respective materials and the respective thicknesses of the layers are also merely exemplified, and thus are not limited to those described above.

Further, the light-shielding section 42 (and the light-shielding section 52) described in the foregoing embodiment, etc. are not necessarily formed between all of the pixels P adjacent to each other.

Furthermore, the foregoing embodiment, etc. describes the example using the compound semiconductor as the constituent material of the photoelectric conversion layer 22, etc. but this is not limitative. Effects similar to the effects described in the foregoing embodiment, etc. are also obtained by applying the technology to, for example, a light receiving element configured using an organic semiconductor.

Moreover, the effects described in the foregoing embodiment, etc. are merely exemplified, and may be any other effects or may further include any other effects.

It is to be noted that the present disclosure may have the following configurations.

(1)
A light receiving element including:
a plurality of pixels;
a photoelectric conversion layer common to the plurality of pixels;
a first electrode layer provided on side of a light incident surface of the photoelectric conversion layer; and
a light-shielding section embedded between the plurality of pixels adjacent to each other of the first electrode layer.

(2)
The light receiving element according to (1), in which the photoelectric conversion layer absorbs a wavelength in at least an infrared region and generates electric charges.

(3)
The light receiving element according to (1) or (2), further including a first semiconductor layer provided between the photoelectric conversion layer and the first electrode layer.

(4)
The light receiving element according to any one of (1) to (3), further including:
a protective layer;
a color filter; and
a condensing lens,
the color filter and the condensing lens being laminated in this order on the first electrode layer with the protective layer interposed therebetween.

(5)
The light receiving element according to (4), in which one surface of the light-shielding section extends to a top surface of the color filter.

(6)
The light receiving element according to any one of (3) to (5), in which another surface of the light-shielding section extends to an inside of the first semiconductor layer.

(7)
The light receiving element according to any one of (1) to (6), in which the light-shielding section has a forward tapered shape.

(8)
The light receiving element according to any one of (3) to (7), further including a second semiconductor layer on a surface, of the photoelectric conversion layer, opposite to the first semiconductor layer,
the second semiconductor layer including
a first conductivity-type region, and
a second conductivity-type region formed around the first conductivity-type region.

(9)
The light receiving element according to (8), in which
the first conductivity-type region is provided for each of the plurality of pixels, and
the plurality of pixels adjacent to each other are electrically separated by a boundary between the first conductivity-type region and the second conductivity-type region.

(10)
The light receiving element according to (8) or (9), further including a multilayer wiring board disposed on a surface, of the photoelectric conversion layer, opposite to the light incident surface, with the second semiconductor layer interposed therebetween, the multilayer wiring board including a readout circuit.

(11)
The light receiving element according to (10), further including a second electrode provided between the second semiconductor layer and the multilayer wiring board, the second electrode electrically coupling the first conductivity-type region and the readout circuit to each other.

(12)
The light receiving element according to any one of (8) to (11), in which the photoelectric conversion layer, the first semiconductor layer, and the second semiconductor layer are each configured by a compound semiconductor.

(13)
The light receiving element according to (12), in which the compound semiconductor is an III-V group semiconductor.

(14)
The light receiving element according to any one of (8) to (13), in which the photoelectric conversion layer is configured by $In_xGa_{(1-x)}As$ (where $0<x\leq 1$ holds true), and
the first semiconductor layer and the second semiconductor layer are each configured by InP or InGaAs.

(15)
The light receiving element according to any one of (1) to (14), in which the first electrode layer includes indium-titanium oxide.

(16)
The light receiving element according to any one of (1) to (15), in which the first electrode layer includes a plurality of slits in a plane.

(17)
The light receiving element according to any one of (4) to (16), in which the protective layer is configured by a silicon nitride film or a silicon oxide film.

(18)
A method of manufacturing a light receiving element, the method including:
forming a photoelectric conversion layer common to a plurality of pixels;
forming a first electrode layer on side of a light incident surface of the photoelectric conversion layer; and forming a light-shielding, section, embedded between the plurality of pixels adjacent to each other of the first electrode layer.

(19) An imaging device including:
a plurality of pixels;
a photoelectric conversion layer con mon to the plurality of pixels;
a first electrode layer provided on side of a light incident surface of the photoelectric conversion layer; and
a light-shielding section embedded between the plurality of pixels adjacent to each other of the first electrode layer.

(20) An electronic apparatus including an imaging device that includes a plurality of pixels,
the imaging device including
a photoelectric conversion layer common to the plurality of pixels,
a first electrode layer provided on side of a light incident surface of the photoelectric conversion layer, and
a light-shielding section embedded between the plurality of pixels adjacent to each other of the first electrode layer.

This application claims the benefit of Japanese Priority Patent Application JP2016-142826 filed with the Japan Patent Office on Jul. 20, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A light receiving element comprising:
a plurality of pixels;
a photoelectric conversion layer common to the plurality of pixels;
a first electrode layer provided on a light incident surface side of the photoelectric conversion layer, wherein the first electrode layer includes a plurality of first electrodes, and wherein at least one first electrode is provided for each pixel in the plurality of pixels;
a light-shielding section embedded between adjacent first electrodes of the first electrode layer; and
a first semiconductor layer provided between the photoelectric conversion layer and the first electrode layer, wherein a surface of the light-shielding section extends to an inside of the first semiconductor layer.

2. The light receiving element according to claim 1, wherein the photoelectric conversion layer absorbs a wavelength in at least an infrared region and generates electric charges.

3. The light receiving element according to claim 1, further comprising:
a protective layer;
a color filter; and
a condensing lens,
the color filter and the condensing lens being laminated in this order on the first electrode layer with the protective layer interposed therebetween.

4. The light receiving element according to claim 3, wherein another surface of the light-shielding section extends to a top surface of the color filter.

5. The light receiving element according to claim 3, wherein the protective layer is configured by a silicon nitride film or a silicon oxide film.

6. The light receiving element according to claim 1, wherein the light-shielding section has a forward tapered shape.

7. The light receiving element according to claim 1, further comprising a second semiconductor layer on a surface of the photoelectric conversion layer opposite to the first semiconductor layer,
the second semiconductor layer including
a first conductivity-type region, and
a second conductivity-type region formed around the first conductivity-type region.

8. The light receiving element according to claim 7, wherein
the first conductivity-type region is provided for each of the plurality of pixels, and
the plurality of pixels adjacent to each other are electrically separated by a boundary between the first conductivity-type region and the second conductivity-type region.

9. The light receiving element according to claim 7, further comprising a multilayer wiring board disposed on a surface of the photoelectric conversion layer opposite to the light incident surface, with the second semiconductor layer interposed therebetween, the multilayer wiring board including a readout circuit.

10. The light receiving element according to claim 9, further comprising a second electrode provided between the second semiconductor layer and the multilayer wiring board, the second electrode electrically coupling the first conductivity-type region and the readout circuit to each other.

11. The light receiving element according to claim 7, wherein the photoelectric conversion layer, the first semiconductor layer, and the second semiconductor layer are each configured by a compound semiconductor.

12. The light receiving element according to claim 11, wherein the compound semiconductor comprises an III-V group semiconductor.

13. The light receiving element according to claim 7, wherein
the photoelectric conversion layer is configured by InxGa(1-x)As (where $0<x\leq1$ holds true), and
the first semiconductor layer and the second semiconductor layer are each configured by InP or InGaAs.

14. The light receiving element according to claim 1, wherein the first electrode layer includes indium-titanium oxide.

15. The light receiving element according to claim 1, wherein the first electrode layer includes a plurality of slits in a plane.

16. A method of manufacturing a light receiving element, the method comprising:
forming a photoelectric conversion layer common to a plurality of pixels;
forming a first electrode layer on a light incident surface side of the photoelectric conversion layer, wherein the first electrode layer includes a plurality of first electrodes, and wherein at least one first electrode is provided for each pixel in the plurality of pixels;
forming a light-shielding section embedded between adjacent first electrodes of the first electrode layer; and
forming a first semiconductor layer between the photoelectric conversion layer and the first electrode layer, wherein a surface of the light-shielding section extends to an inside of the first semiconductor layer.

17. An imaging device comprising:
a plurality of pixels;
a photoelectric conversion layer common to the plurality of pixels;
a first electrode layer provided on a light incident surface side of the photoelectric conversion layer, wherein the first electrode layer includes a plurality of first electrodes, and wherein at least one first electrode is provided for each pixel in the plurality of pixels;
a light-shielding section embedded between adjacent first electrodes of the first electrode layer; and
a first semiconductor layer provided between the photoelectric conversion layer and the first electrode layer, wherein a surface of the light-shielding section extends to an inside of the first semiconductor layer.

18. An electronic apparatus comprising an imaging device that includes a plurality of pixels,
the imaging device including:
a photoelectric conversion layer common to the plurality of pixels,
a first electrode layer provided on a light incident surface side of the photoelectric conversion layer, wherein the first electrode layer includes a plurality of first electrodes, and wherein at least one first electrode is provided for each pixel in the plurality of pixels;
a light-shielding section embedded between adjacent first electrodes of the first electrode layer, and
a first semiconductor layer provided between the photoelectric conversion layer and the first electrode layer, wherein a surface of the light-shielding section extends to an inside of the first semiconductor layer.

* * * * *